(12) United States Patent
Liu et al.

(10) Patent No.: US 11,527,476 B2
(45) Date of Patent: Dec. 13, 2022

(54) INTERCONNECT STRUCTURE OF SEMICONDUCTOR DEVICE

(71) Applicant: Taiwan Semiconductor Manufacturing Co., Ltd., Hsinchu (TW)

(72) Inventors: Yao-Min Liu, Taipei (TW); Chia-Pang Kuo, Taoyuan (TW); Chien Chung Huang, Taichung (TW); Chih-Yi Chang, New Taipei (TW); Ya-Lien Lee, Baoshan Township (TW); Chun-Chieh Lin, Taichung (TW); Hung-Wen Su, Jhubei (TW); Ming-Hsing Tsai, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 67 days.

(21) Appl. No.: 17/143,496

(22) Filed: Jan. 7, 2021

(65) Prior Publication Data

US 2022/0084937 A1 Mar. 17, 2022

Related U.S. Application Data

(60) Provisional application No. 63/076,999, filed on Sep. 11, 2020.

(51) Int. Cl.
*H01L 23/522* (2006.01)
*H01L 21/768* (2006.01)

(52) U.S. Cl.
CPC .... *H01L 23/5226* (2013.01); *H01L 21/76843* (2013.01); *H01L 21/76879* (2013.01)

(58) Field of Classification Search
CPC .......... H01L 23/5226; H01L 21/76843; H01L 21/76879; H01L 2221/1063; H01L 21/76826; H01L 21/76844; H01L 21/76846; H01L 23/53238; H01L 21/76814; H01L 21/76831; H01L 23/528; H01L 2221/1057
See application file for complete search history.

(56) References Cited

U.S. PATENT DOCUMENTS

| | | | | |
|---|---|---|---|---|
| 7,964,497 B2 * | 6/2011 | McFeely | ........... | H01L 23/53238 438/653 |
| 2008/0132057 A1 * | 6/2008 | Feustel | ............. | H01L 21/76844 438/627 |
| 2008/0280432 A1 | 11/2008 | Chang et al. | | |
| 2009/0209099 A1 * | 8/2009 | Yu | ..................... | H01L 21/76873 438/653 |
| 2020/0105592 A1 | 4/2020 | Kuo et al. | | |

* cited by examiner

*Primary Examiner* — Karen Kusumakar
(74) *Attorney, Agent, or Firm* — Slater Matsil, LLP

(57) ABSTRACT

A semiconductor structure and a method of forming the same are provided. A method includes depositing a dielectric layer over a conductive feature. The dielectric layer is patterned to form an opening therein. The opening exposes a first portion of the conductive feature. A first barrier layer is deposited on a sidewall of the opening. The first portion of the conductive feature remains exposed at the end of depositing the first barrier layer.

20 Claims, 21 Drawing Sheets

INTERCONNECT STRUCTURE OF SEMICONDUCTOR DEVICE

PRIORITY CLAIM AND CROSS-REFERENCE

This application claims the benefit of U.S. Provisional Application No. 63/076,999, filed on Sep. 11, 2020, which applications are hereby incorporated herein by reference.

BACKGROUND

Generally, active devices and passive devices are formed on and in a semiconductor substrate. Once formed, these active devices and passive devices may be connected to each other and to external devices using a series of conductive and insulating layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
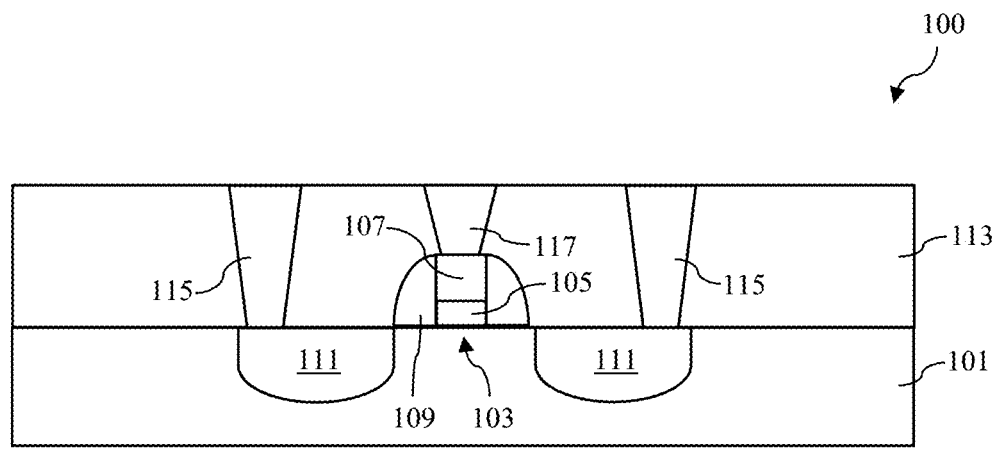
FIGS. 1-17 illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an interconnect structure of a semiconductor device and a method of forming the same. Some embodiments allow for altering a deposition rate of a barrier layer on a surface of a first conductive feature that is exposed by an opening in an overlying dielectric layer, such that the deposition rate on the bottom of the opening (i.e., on the exposed surface of the first conductive feature) is reduced or suppressed, and such that the barrier layer is selectively deposited on sidewalls of the opening and not on the bottom of the opening. In some embodiments, the deposition rate of the barrier layer on the bottom of the opening may be reduced or suppressed by performing a surface modification process on the exposed surface of the first conductive feature. In some embodiments, the surface modification process includes performing an oxide reduction process on the exposed surface of the conductive feature followed by performing a surfactant soaking process on the exposed surface of the conductive feature. Various embodiments discussed herein allow for reducing an amount of the barrier layer within the opening and reducing a contact resistance between the first conductive feature and a second conductive feature formed in the opening.

FIGS. 1-17 illustrate cross-sectional views of various intermediate stages of fabrication of a semiconductor device 100 in accordance with some embodiments. Referring to FIG. 1, the process for forming the semiconductor device 100 comprises providing a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1 as a single transistor) are formed on the substrate 101. The one or more active and/or passive devices 103 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, the transistor 103 includes a gate stack comprising a gate dielectric 105 and a gate electrode 107, spacers 109 on opposite sidewalls of the gate stack, and source/drain regions 111 adjacent to the respective spacers 109. For simplicity, components that are commonly formed in integrated circuits, such as gate silicides, source/drain silicides, contact etch stop layers, and the like, are not illustrated. In some embodiments, the transistor 103 may be formed using any acceptable methods. In some embodiments, the transistor 103 may be a planar MOSFET, a FinFET, or the like.

In some embodiments, one or more interlayer dielectric (ILD) layers 113 are formed over the substrate and the one or more active and/or passive devices 103. In some embodiments, the one or more ILD layers 113 may comprise, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, chemical vapor deposition (CVD), plasma-enhanced CVD (PECVD), atomic layer deposition (ALD), a combination thereof, or the like.

In some embodiments, source/drain contact plugs 115 and a gate contact plug 117 are formed in the one or more ILD layers 113. The source/drain contact plugs 115 provide electrical contacts to the source/drain regions 111. The gate contact plug 117 provides electrical contact to the gate electrode 107. In some embodiments, the steps for forming the contact plugs 115 and 117 include forming openings in the one or more ILD layers 113, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, topmost surfaces of the contact plugs 115 and 117 are substantially coplanar or level with a topmost surface of the one or more ILD layers 113 within process variations of the CMP process.

In some embodiments, the one or more barrier/adhesion layers may comprise titanium, titanium nitride, tantalum, tantalum nitride, a combination thereof, a multilayer thereof, or the like, and may be formed using physical vapor deposition (PVD), CVD, ALD, a combination thereof, or the like. The one or more barrier/adhesion layers protect the one or more ILD layers 113 from diffusion and metallic poisoning. The seed layers may comprise copper, titanium, nickel, gold, manganese, a combination thereof, a multilayer thereof, or the like, and may be formed by ALD, CVD, PVD, sputtering, a combination thereof, or the like. The conductive material may comprise copper, aluminum, tungsten, cobalt, ruthenium, combinations thereof, alloys thereof, multilayers thereof, or the like, and may be formed using, for example, plating, or other suitable methods.

Figure 2:
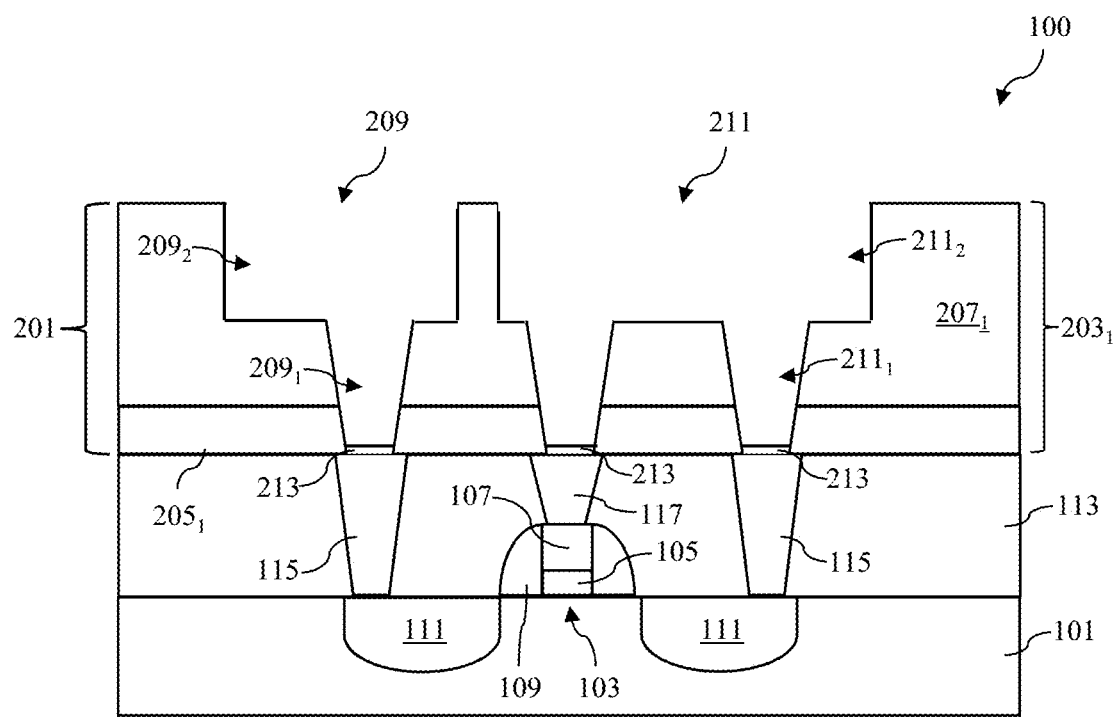

FIGS. 2-17 illustrate cross-sectional views of various intermediate stages of fabrication of an interconnect structure 201 over the structure of FIG. 1 in accordance with some embodiments. Referring to FIG. 2, in some embodiments, the steps for forming the interconnect structure 201 starts with forming a metallization layer $203_1$ over the one or more ILD layers 113 and the contact plugs 115 and 117. In some embodiments, the formation of the metallization layer $203_1$ starts with forming an etch stop layer (ESL) $205_1$ over the one or more ILD layers 113 and the contact plugs 115 and 117, and forming an inter-metal dielectric (IMD) layer $207_1$ over the ESL $205_1$.

In some embodiments, a material for the ESL $205_1$ is chosen such that an etch rate of the ESL $205_1$ is less than an etch rate of the IMD layer $207_1$. In some embodiments, the ESL $205_1$ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like. In some embodiments, the IMD layer $207_1$ may be formed using similar materials and methods as the one or more ILD layers 113 described above with reference to FIG. 1, and the description is not repeated herein. In some embodiments, the one or more ILD layers 113 and the IMD layer $207_1$ may comprise a same material. In other embodiments, the one or more ILD layers 113 and the IMD layer $207_1$ may comprise different materials.

Referring further to FIG. 2, the IMD layer $207_1$ and the ESL $205_1$ are patterned to form openings 209 and 211 in the IMD layer $207_1$ and the ESL $205_1$. In some embodiments, the opening 209 exposes a top surface of the source/drain contact plug 115, and the opening 211 exposes a top surface of the source/drain contact plug 115 and a top surface of the gate contact plug 117. The opening 209 comprises a lower portion $209_1$, which may be also referred to as a via opening $209_1$, and an upper portion $209_2$, which may be also referred to as a line opening $209_2$. The opening 211 comprises lower portions $211_1$, which may be also referred to as via openings $211_1$, and an upper portion $211_2$, which may be also referred to as a line opening $211_2$. In some embodiments, the openings 209 and 211 may be formed by a "via first" process. In such embodiments, the via openings of the openings 209 and 211 are formed before the line openings of the openings 209 and 211. In other embodiments, the openings 209 and 211 may be formed by a "trench first" process. In such embodiments, the via openings of the openings 209 and 211 are formed after the line openings of the openings 209 and 211. In some embodiments, the openings 209 and 211 may be formed using suitable photolithography and etching processes. The etching processes may include one or more dry etching process. The etching processes may be anisotropic.

In some embodiments, after forming the openings 209 and 211, the resulting structure is transferred to a non-vacuum tool for forming a barrier layer as described below with reference to FIGS. 3-5. In such embodiments, oxide layers 213 are formed on the exposed surfaces of the contact plugs 115 and 117. The oxide layers 213 are native oxide layers. In some embodiments when the contact plugs 115 and 117 comprise a metallic material, the oxide layers 213 comprise an oxide of the metallic material.

Figure 3:
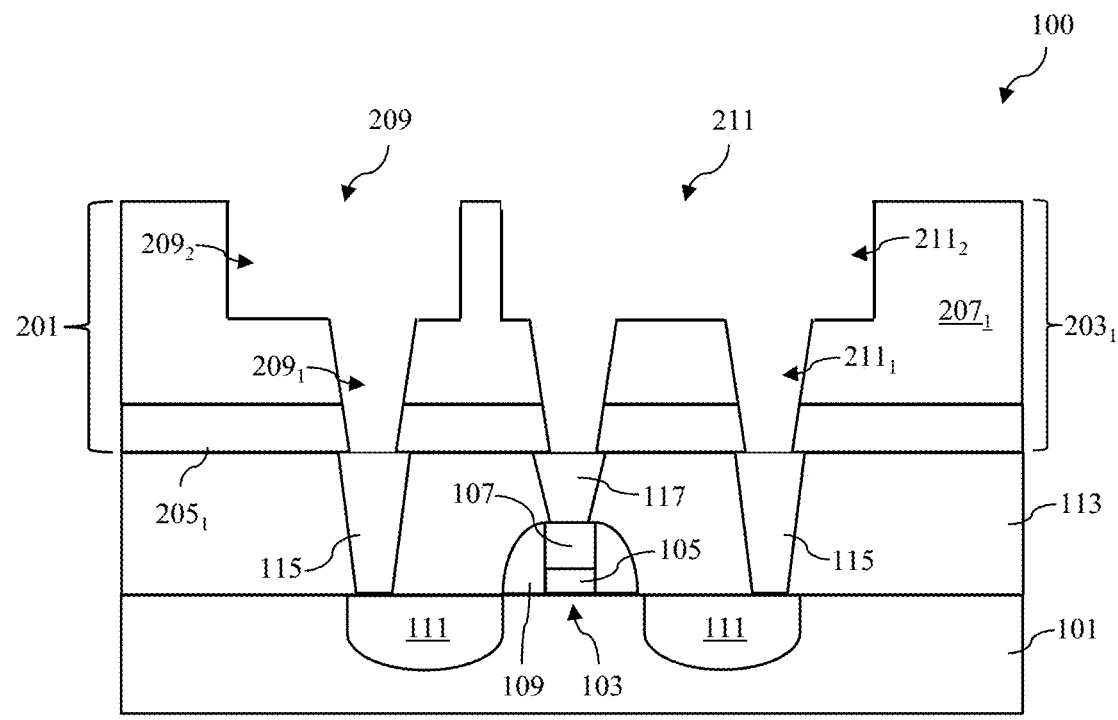
Figure 4:
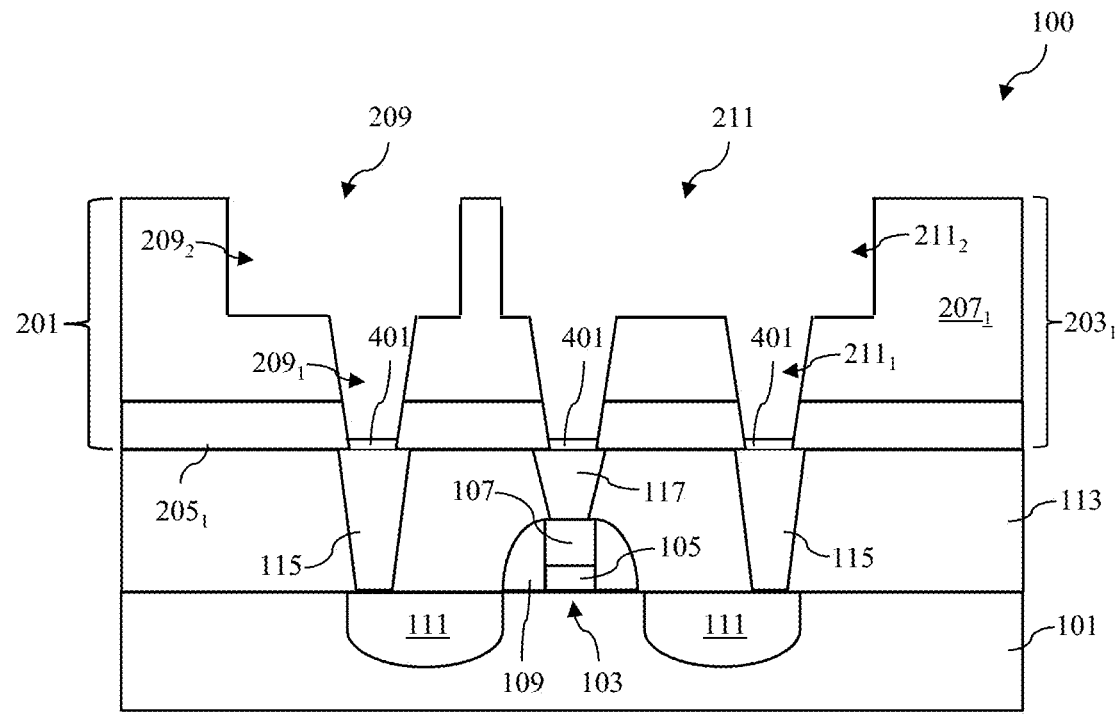
Figure 5:
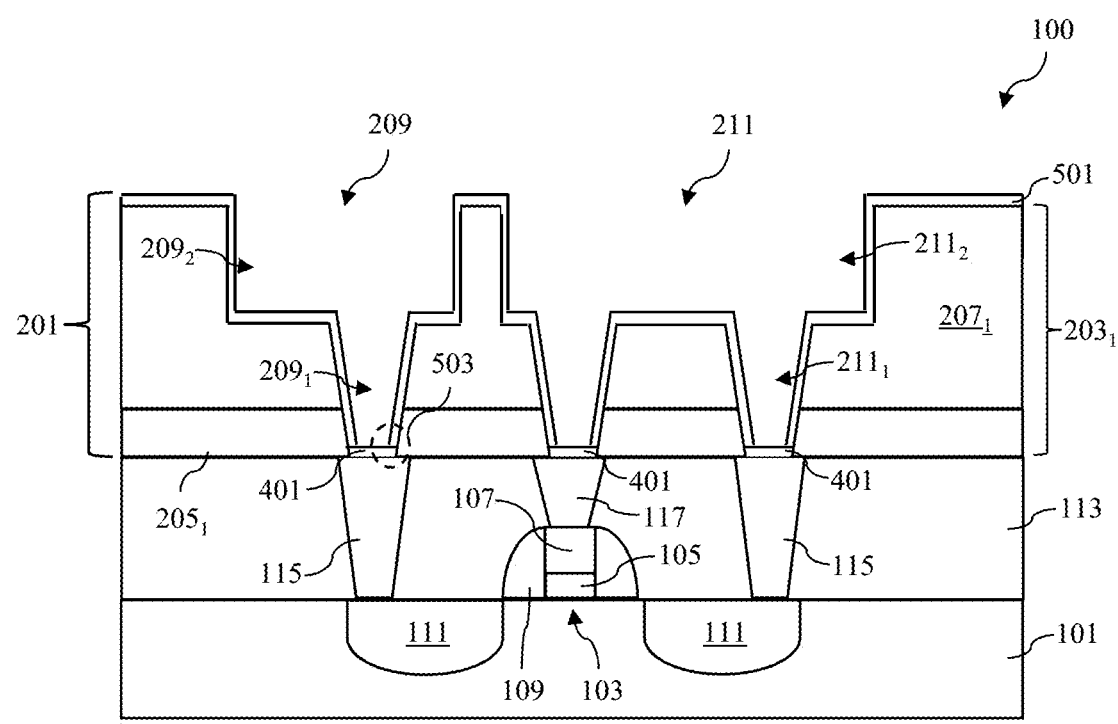

FIGS. 3-5 illustrate cross-sectional views of various intermediate stages of fabrication of a barrier layer 501 in the openings 209 and 211 in accordance with some embodiments. In particular, FIGS. 3 and 4 illustrate a surface modification process performed on the exposed surfaces of the contact plugs 115 and 117, and FIG. 5 illustrates a selective deposition process for forming the barrier layer 501.

Referring to FIG. 3, an oxide reduction process is performed on the structure of FIG. 2. In some embodiments, the oxide reduction process removes oxygen from the oxide layers 213 (see FIG. 2). In some embodiments when the oxide layers 213 comprise an oxide of a metallic material, the oxide reduction process removes oxygen from the oxide of the metallic material and leaves the metallic material behind. In some embodiments, the oxide reduction process comprises performing a plasma process on the oxide layers 213 (see FIG. 2).

In some embodiments when the oxide layers 213 comprise copper oxide, cobalt oxide, or ruthenium oxide, the plasma process may comprise an $H_2$ plasma process. In some embodiments, the $H_2$ plasma process is a remote plasma process with a positive ion filter, and may be performed at a temperature between about 300° C. and 350° C., and at a pressure between about 0.2 Torr to 3 Torr. In some embodiments, in addition to removing oxygen from the oxide layers 213, the $H_2$ plasma process may also remove etch byproducts formed on sidewalls and bottoms of the openings 209 and 211 during the etching process for forming the openings 209 and 211 (see FIG. 2).

In some embodiments wherein the oxide layers 213 (see FIG. 2) comprise tungsten oxide, the $H_2$ plasma process may not be efficient for removing oxygen from the tungsten oxide without causing carbon depletion of a low-k material of the IMD layer $207_1$. In such embodiments, the plasma process comprises an Ar plasma process followed by the $H_2$ plasma process. In some embodiments, the Ar plasma process is a direct plasma process, and may be performed at a temperature between about 300° C. and 350° C., and at a pressure between about 2 mTorr to 30 mTorr.

Referring to FIG. 4, a surfactant soaking process is performed on the structure of FIG. 3. In some embodiments, the surfactant soaking process is performed by soaking the structure in a gas of surfactant molecules. The surfactant molecules may be alkene molecules, alkyne molecules, or the like. The alkene molecules have a chemical formula $C_nH_{2n+1}CH=CHC_mH_{2m+1}$, with n and m being in a range from 0 to 10, and with n and m being equal or different from one another. The alkyne molecules have a chemical formula $C_nH_{2n+1}C\equiv CC_mH_{2m+1}$, with n and m being in a range from 0 to 10, and with n and m being equal or different from one another. In some embodiments, the surfactant soaking process is performed for a soaking process time between about 20 sec to about 300 sec. In some embodiments, the surfactant soaking process forms surfactant layers 401 on the exposed surfaces of the contact plugs 115 and 117. In some embodies, the surfactant layers 401 are not formed on surfaces of the IMD layer $207_1$ exposed by the openings 209 and 211. In some embodiments, the surfactant layers 401 may comprises one or more layers of the surfactant molecules. Each of the surfactant layers 401 may be a monolayer. In some embodiments, the surfaces of the IMD layer $207_1$ exposed by the openings 209 and 211 may be free from surfactant molecules.

Referring to FIG. 5, a barrier layer 501 is formed in the openings 209 and 211, and over the IMD layer $207_1$. The barrier layer 501 may comprise titanium, titanium nitride, tantalum, tantalum nitride, a combination thereof, a multilayer thereof, or the like. In some embodiments, the barrier layer 501 is deposited using an ALD process. The surfactant soaking process described above with reference to FIG. 4, alters an ALD deposition rate of the barrier layer 501 over the exposed surfaces of the contact plugs 115 and 117. In some embodiments, the surfactant soaking process suppresses the ALD deposition rate of the barrier layer 501 over the surfactant layer 401, such that the barrier layer 501 is deposited on the exposed surfaces of the IMD layer $207_1$ and is not deposited over the exposed surfaces of the contact plugs 115 and 117.

Figure 6:
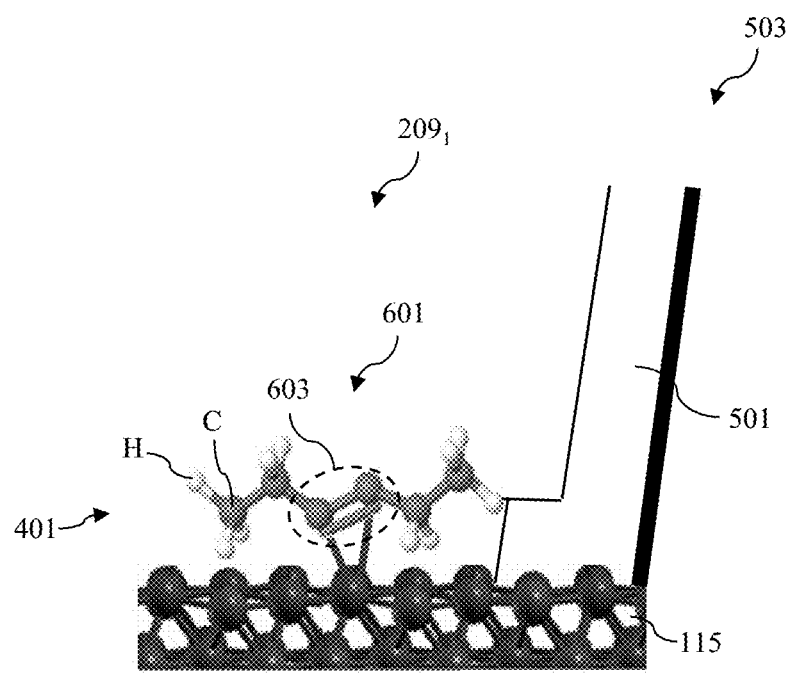

FIG. 6 illustrates a magnified view of a region 503 of the structure shown in FIG. 5 in accordance with some embodiments. In some embodiments when the surfactant molecules are alkyne molecules 601, the alkyne molecules 601 are bonded to a conductive material of the contact plug 115 through alkyne moieties 603. In some embodiments, the alkyne moieties 603 of the alkyne molecules 601 are bonded to conductive material of the contact plug 115 by coordinate covalent bonds. In some embodiments, the alkyne molecules 601 are bonded to the exposed surface of the contact plug 115 such that no alkyne molecule is bonded at corners of the via opening $209_1$. In such embodiments, the barrier layer 501 is deposited such that the barrier layer 501 fully covers sidewalls of the via opening $209_1$ and physically contacts the top surface of the contact plug 115. In some embodiments, the barrier layer 501 may partially extend along the top surface of the contact plug 115.

Figure 7:
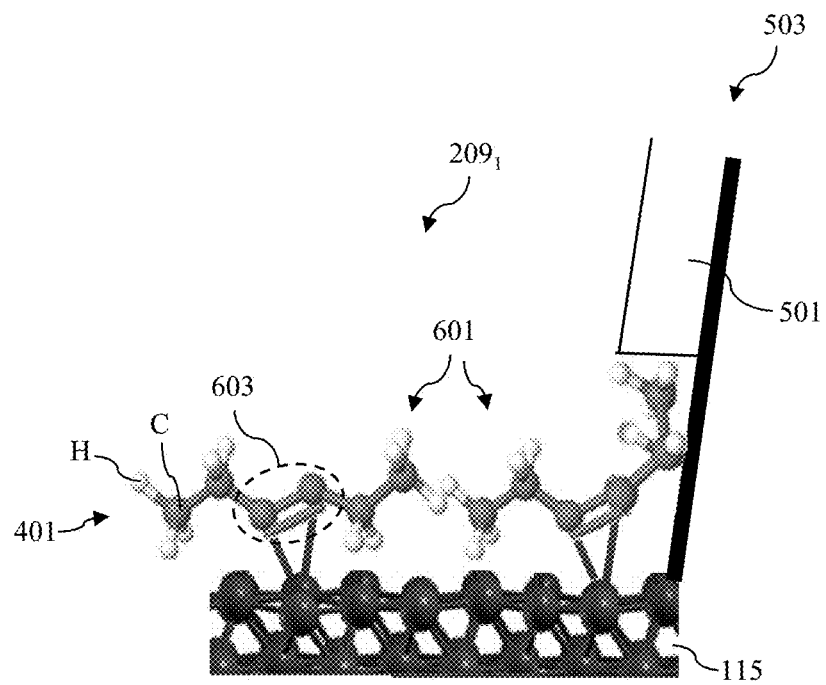

FIG. 7 illustrates a magnified view of the region 503 of the structure shown in FIG. 5 in accordance with some embodiments. In some embodiments when the surfactant molecules are alkyne molecules 601, the alkyne molecules 601 are bonded to a conductive material of the contact plug 115 through alkyne moieties 603. In some embodiments, the alkyne moieties 603 of the alkyne molecules 601 are bonded to conductive material of the contact plug 115 by coordinate covalent bonds. In some embodiments, the alkyne molecules 601 are bonded to the exposed surface of the contact plug 115 such that the alkyne molecules 601 cover corners of the via opening $209_1$. In such embodiments, the barrier layer 501 is deposited such that the barrier layer 501 partial covers the sidewalls of the via opening $209_1$ and does not cover the corners of the via opening $209_1$ due to the steric hindrance effect. In some embodiments, the barrier layer 501 is not in physical contact with the top surface of the contact plug 115.

Figure 8:
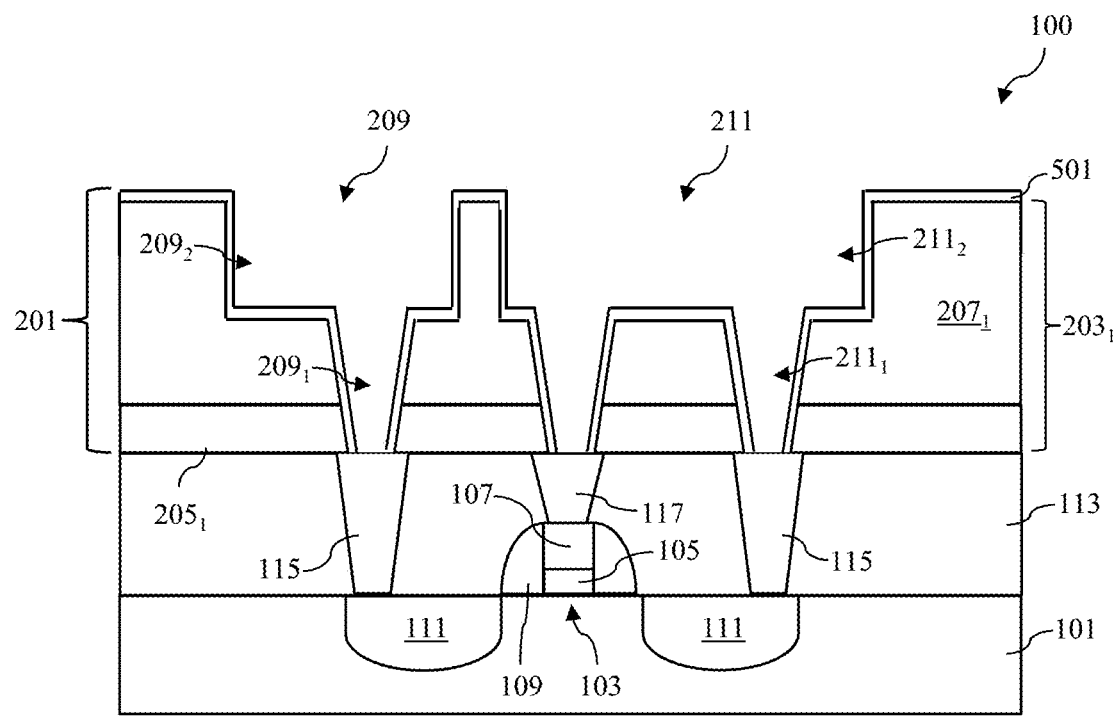

Referring to FIG. 8, in some embodiments, after forming the barrier layer 501, a plasma process is performed on the barrier layer 501 to densify the material of the barrier layer 501. In some embodiments, the plasma process is an $H_2$ plasma process. In some embodiments, the $H_2$ plasma process further removes the surfactant layer 401 (see FIG. 5) and exposes the top surfaces of the contact plugs 115 and 117.

Figure 9:
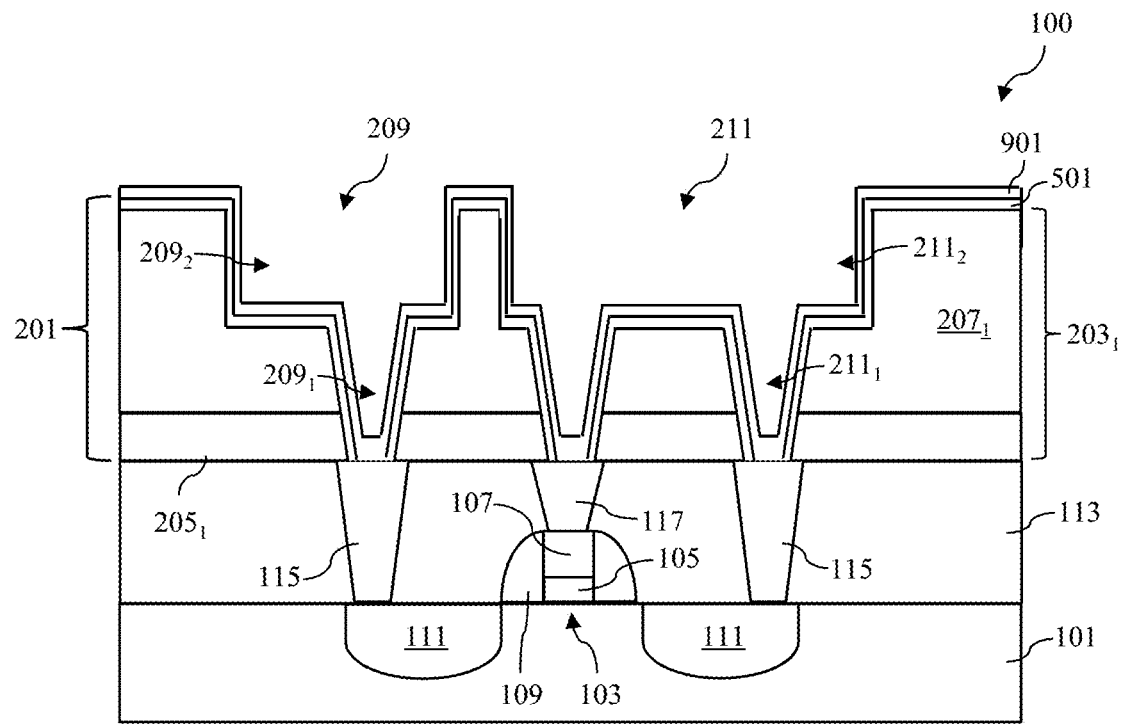

Referring to FIG. 9, an adhesion layer 901 is formed in the openings 209 and 211, and over the IMD layer $207_1$. The adhesion layer 901 may comprise cobalt, ruthenium, an alloy thereof, a combination thereof, a multilayer thereof, or the like, and may be formed by ALD, CVD, PVD, sputtering, a combination thereof, or the like.

Figure 10:
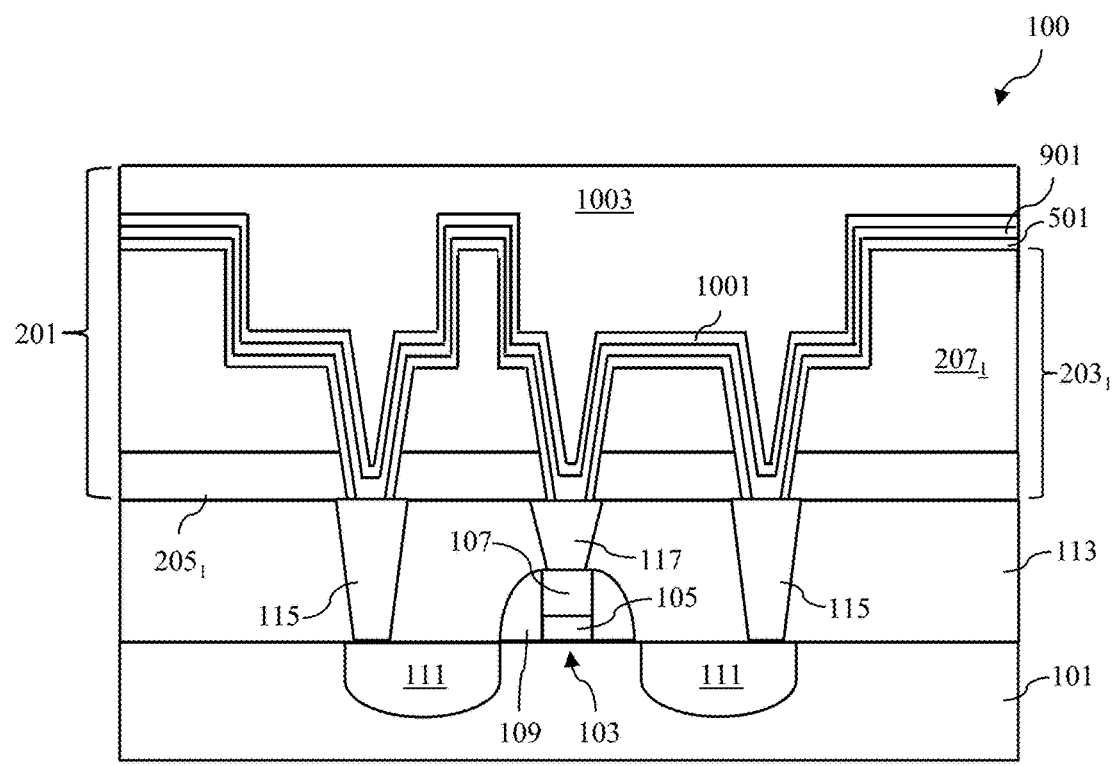

Referring to FIG. 10, a seed layer 1001 is formed over the adhesion layer 901 within the openings 209 and 211, and over the IMD layers $207_1$. The seed layer 1001 may comprise copper, titanium, nickel, gold, manganese, a combination thereof, a multilayer thereof, or the like, and may be formed by ALD, CVD, PVD, sputtering, a combination thereof, or the like. Subsequently, a conductive material 1003 is formed over the seed layer 1001 within the openings 209 and 211, and over the IMD layers $207_1$. In some embodiments, the conductive material 1003 overfills the openings 209 and 211. The conductive material 1003 may comprise copper, aluminum, tungsten, ruthenium, cobalt, combinations thereof, alloys thereof, multilayers thereof, or the like, and may be formed using, for example, plating, or other suitable methods.

Figure 11:
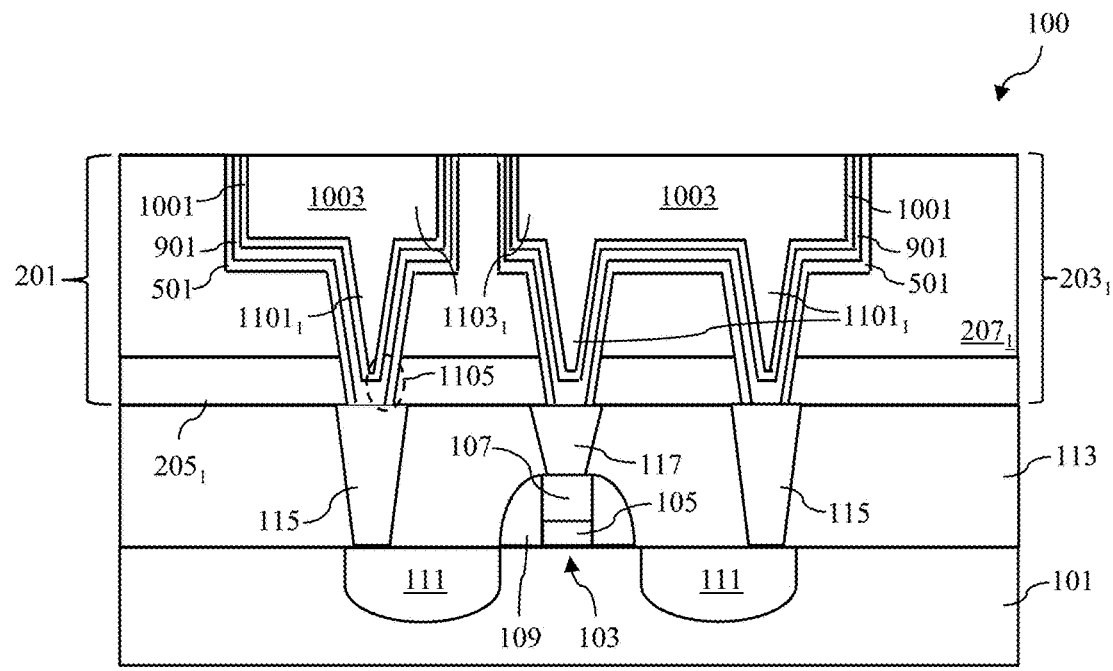

Referring to FIG. 11, portions of the barrier layer 501, the adhesion layer 901, the seed layer 1001, and the conductive material 1003 overfilling the openings 209 and 211 (see FIG. 9) are removed to expose a top surface of the IMD layer $207_1$. In some embodiments, the removal process may be a planarization process comprising a CMP process, a grinding process, an etching process, a combination thereof, or the like. Remaining portions of the barrier layer 501, the adhesion layer 901, the seed layer 1001, and the conductive material 1003 filling the via openings $209_1$ and $211_1$ (see FIG. 9) form conductive vias $1101_1$, and remaining portions of the barrier layer 501, the adhesion layer 901, the seed layer 1001, and the conductive material 1003 filling the line openings $209_2$ and $211_2$ (see FIG. 9) form conductive lines $1103_1$. In some embodiments, topmost surfaces of the conductive lines $1103_1$ are substantially coplanar or level with a topmost surface of the IMD layer $207_1$ within process variations of the planarization process.

Figure 12:
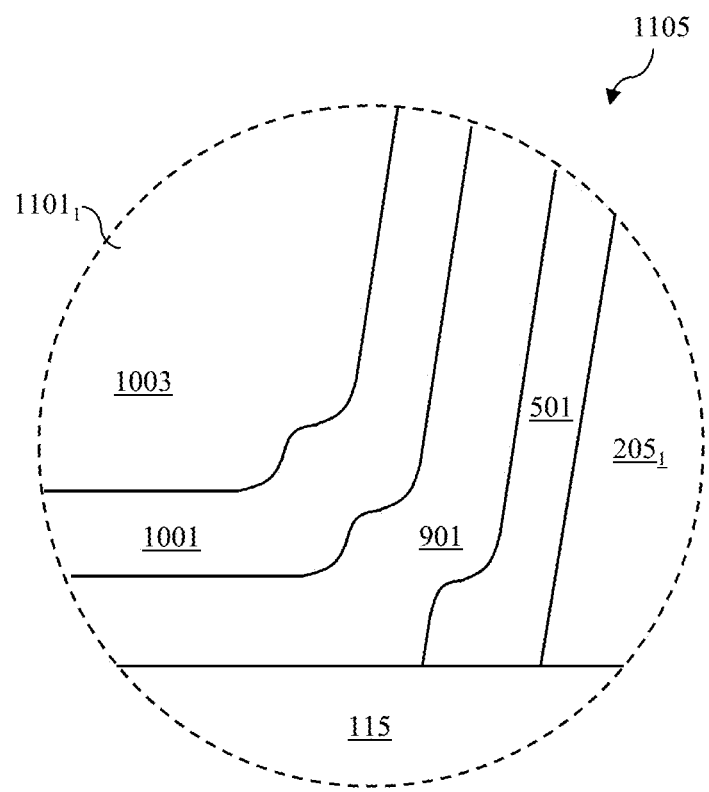

FIG. 12 illustrates a magnified view of a region 1105 of the structure shown in FIG. 11 in accordance with some embodiments. In the illustrated embodiment, the barrier layer 501 is deposited such that the barrier layer 501 fully covers and is in physical contact with sidewalls of the ESL $205_1$, and is in physically contact with the top surface of the contact plug 115. The barrier layer 501 covers corners formed by the sidewalls of the ESL $205_1$ and the top surface of the contact plug 115. In the illustrated embodiment, the adhesion layer 901 extends along and is in physical contact with the top surface of the contact plug 115. By selectively depositing the barrier layer 501 in the openings 209 and 211 (see FIG. 5), an amount (or volume) of the barrier layer 501 within the openings 209 and 211 is reduced. As a result, a contact resistance between the conductive vias $1101_1$ and respective ones of the contact plugs 115 and 117 (see FIG. 11) is reduced.

Figure 13:
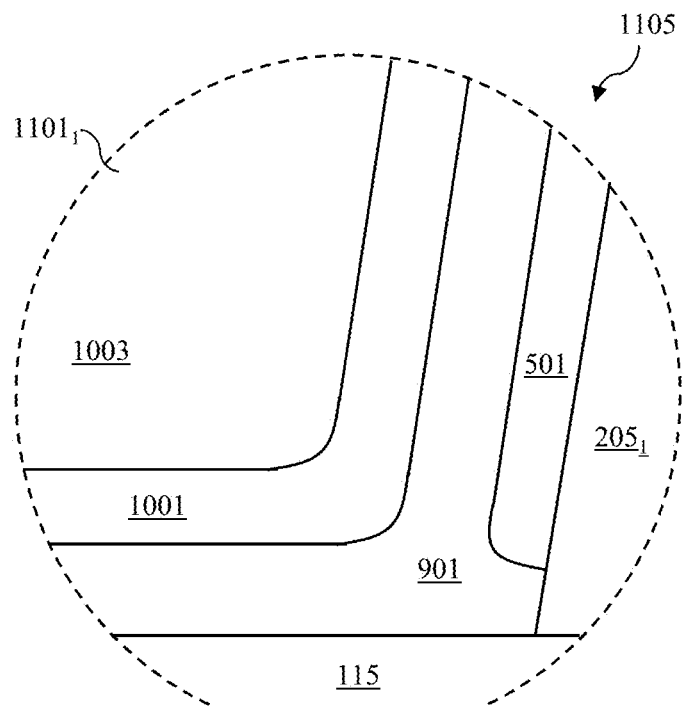

FIG. 13 illustrates a magnified view of the region 1105 of the structure shown in FIG. 11 in accordance with some embodiments. In the illustrated embodiment, the barrier layer 501 is deposited such that the barrier layer 501 partially covers and is in physical contact with sidewalls of the ESL $205_1$, and does not cover corners formed by the sidewalls of the ESL $205_1$ and the top surface of the contact plug 115. In some embodiments, the adhesion layer 901 covers corners formed by the sidewalls of the ESL $205_1$ and the top surface of the contact plug 115, is in physical contact with the sidewalls of the ESL $205_1$, and extends along and is in physical contact with the top surface of the contact plug 115. By selectively depositing the barrier layer 501 in the openings 209 and 211 (see FIG. 5), an amount (or volume) of the barrier layer 501 within the openings 209 and 211 is reduced. As a result, a contact resistance between the conductive vias $1101_1$ and respective ones of the contact plugs 115 and 117 (see FIG. 11) is reduced.

Figure 14:
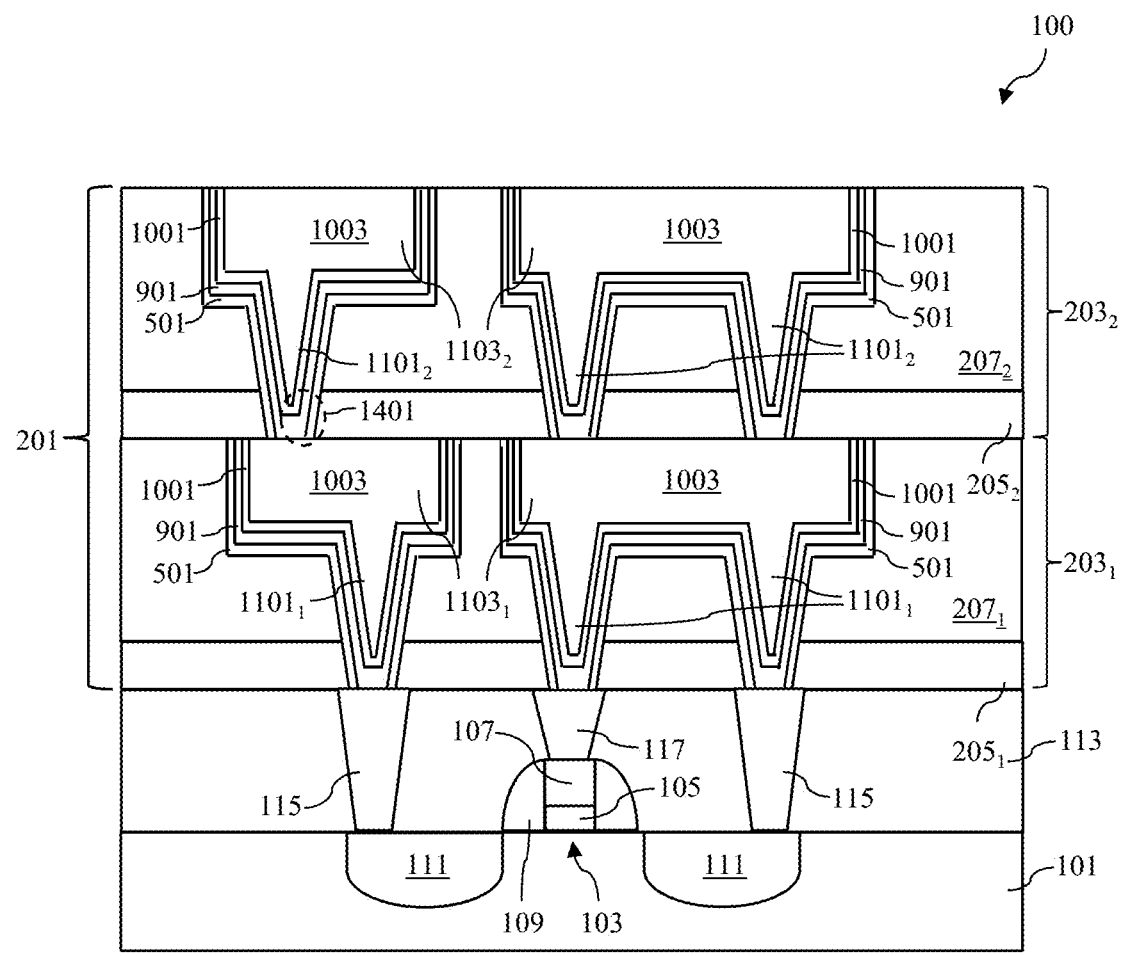

Referring to FIG. 14, a metallization layer $203_2$ is formed over the metallization layer $203_1$. In some embodiments, process steps for forming the metallization layer $203_2$ start with forming an ESL $205_2$ over the metallization layer $203_1$. In some embodiments, the ESL $205_2$ is formed using similar materials and methods as the ESL $205_1$ described above with reference to FIG. 2, and the description is not repeated herein. Subsequently, an IMD layer $207_2$ is formed over the ESL $205_2$. In some embodiments, the IMD layer $207_2$ is formed using similar materials and methods as the IMD layer $207_1$ described above with reference to FIG. 2, and the description is not repeated herein.

In some embodiments, interconnects, such as conductive vias $1101_2$ and conductive lines $1103_2$, are formed in the IMD layer $207_2$ and the ESL $205_2$. In some embodiments, the conductive vias $1101_2$ and the conductive lines $1103_2$ may have similar structures as the conductive vias $1101_1$ and the conductive lines $1103_1$, with similar features being labeled by similar numerical references. In some embodiments, the conductive vias $1101_2$ and the conductive lines $1103_2$ may be formed using process steps as described above with reference to FIGS. 2-11, and the description is not repeated herein.

Figure 15:
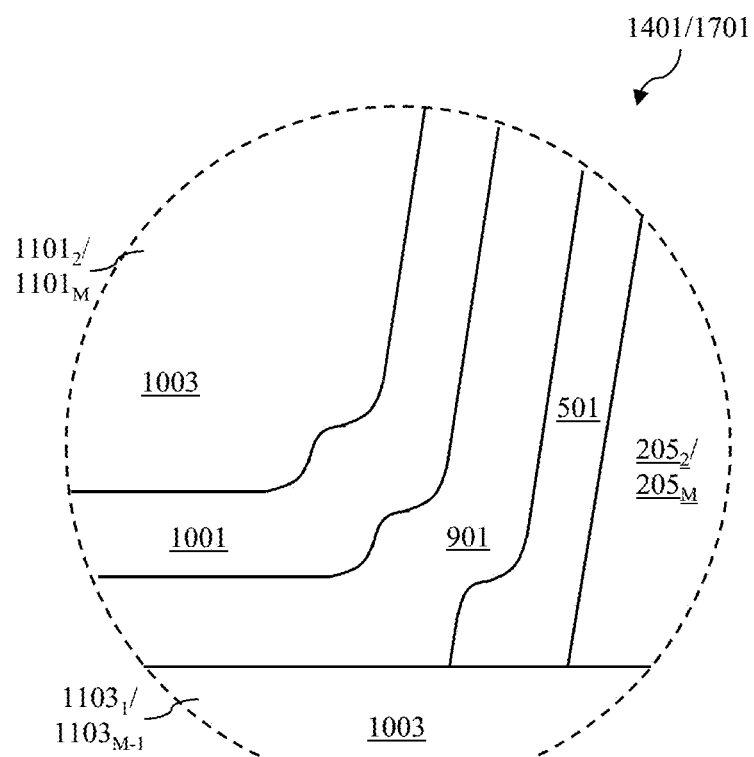

FIG. 15 illustrates a magnified view of a region 1401 of the structure shown in FIG. 14 in accordance with some embodiments. In the illustrated embodiment, the barrier layer 501 is deposited such that the barrier layer 501 fully covers and is in physical contact with sidewalls of the ESL $205_2$, and is in physically contact with the top surface of the conductive material 1003 of the conductive line $1103_1$. The barrier layer 501 covers corners formed by the sidewalls of the ESL $205_2$ and the top surface of the conductive material 1003 of the conductive line $1103_1$. In the illustrated embodiment, the adhesion layer 901 extends along and is in physical contact with the top surface of the conductive material 1003 of the conductive line $1103_1$. By selectively depositing the barrier layer 501 in the openings within the ESL $205_2$ and the IMD layer $207_2$, an amount (or volume) of the barrier layer 501 within the openings is reduced. As a result, a contact resistance between the conductive vias $1101_2$ and respective conductive lines $1103_1$ is reduced.

Figure 16:
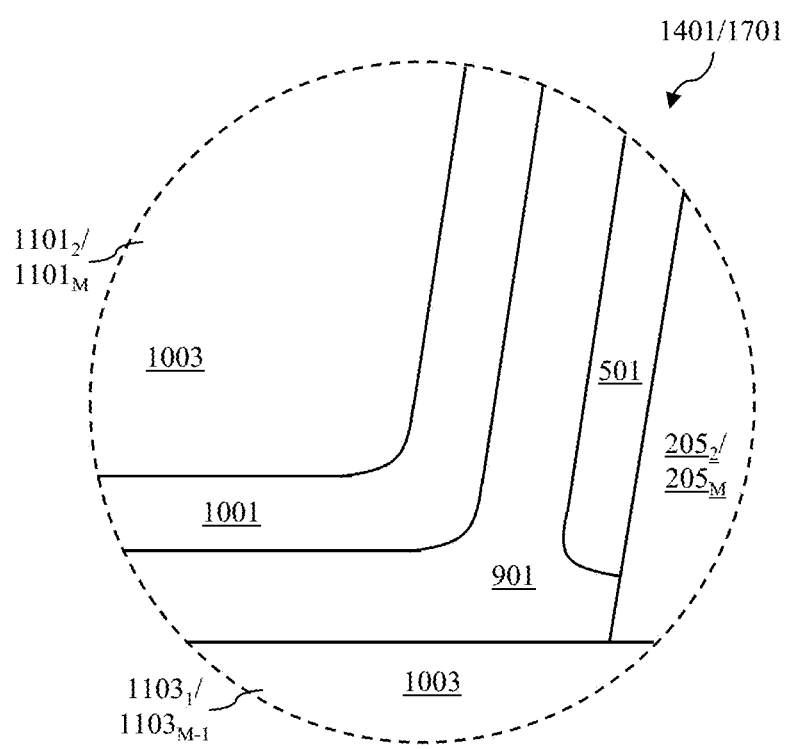

FIG. 16 illustrates a magnified view of the region 1401 of the structure shown in FIG. 14 in accordance with some embodiments. In the illustrated embodiment, the barrier layer 501 is deposited such that the barrier layer 501 partially covers and is in physical contact with sidewalls of the ESL $205_2$, and does not cover corners formed by the sidewalls of the ESL $205_2$ and the top surface of the conductive material 1003 of the conductive line $1103_1$. In some embodiments, the adhesion layer 901 covers corners formed by the sidewalls of the ESL $205_2$ and the top surface of the conductive material 1003 of the conductive line $1103_1$, is in physical contact with the sidewalls of the ESL $205_2$, and extends along and is in physical contact with the top surface of the conductive material 1003 of the conductive line $1103_1$. By selectively depositing the barrier layer 501 in the openings within the ESL $205_2$ and the IMD layer $207_2$, an amount (or volume) of the barrier layer 501 within the openings is reduced. As a result, a contact resistance between the conductive vias $1101_2$ and respective conductive lines $1103_1$ is reduced.

Figure 17:
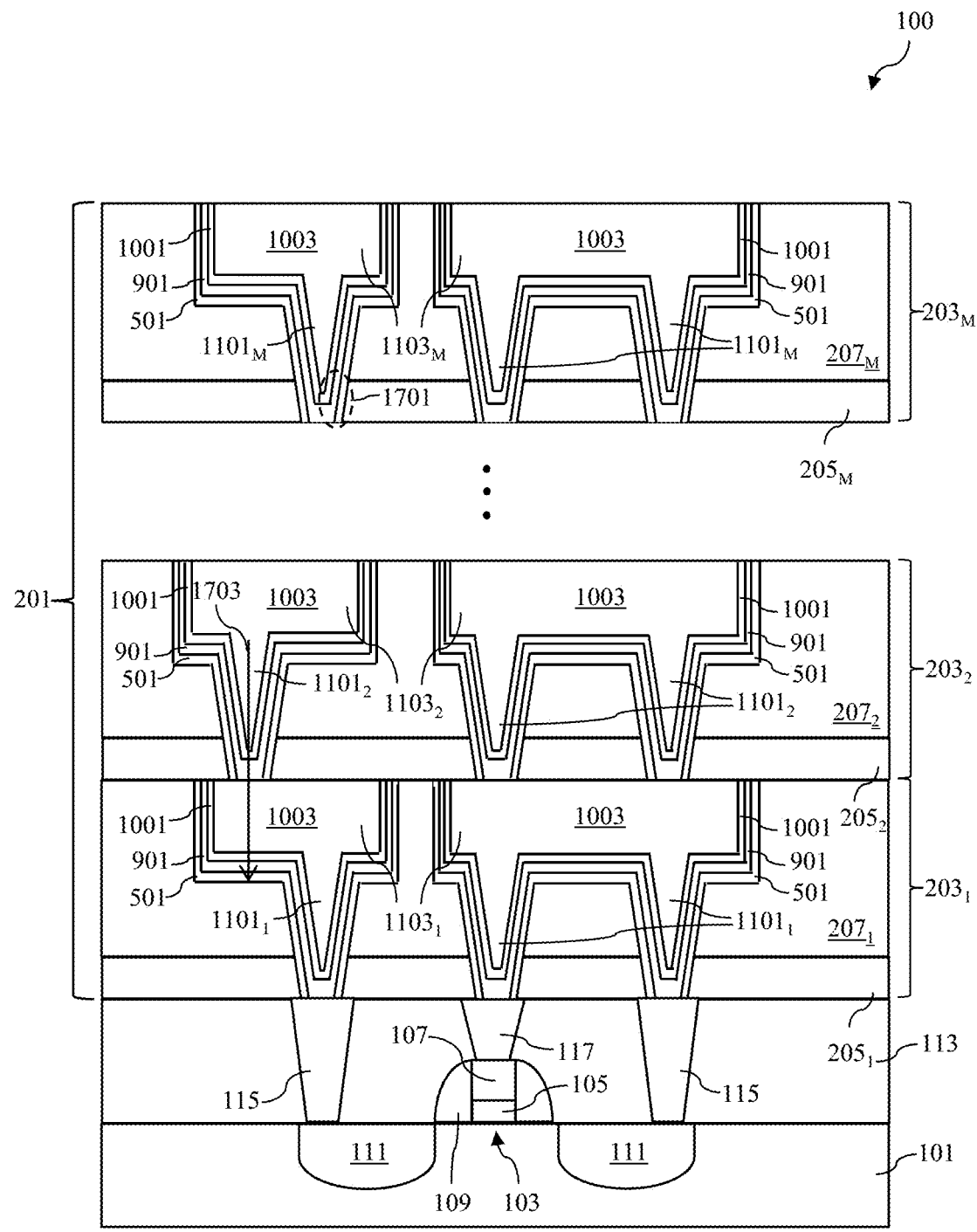

Referring to FIG. 17, one or more metallization layers are formed over the metallization layer $203_2$, until a metallization layer $203_M$ is formed. In some embodiments, the metallization layer $203_M$ is the final metallization layer of the interconnect structure 201. In some embodiments, M may be between 1 and 5. In some embodiments, the intermediated metallization layers between the metallization layer $203_2$ and the metallization layer $203_M$ are formed in a similar manner as the metallization layer $203_1$ and the description is not repeated herein. In other embodiments, the metallization layer $203_M$ is not the final metallization layer of the interconnect structure 201 and additional metallization layers are formed over the metallization layer $203_M$.

In some embodiments, process steps for forming the metallization layer $203_M$ start with forming an ESL $205_M$ over a previous metallization layer. In some embodiments, the ESL $205_M$ is formed using similar materials and methods as the ESL $205_1$ described above with reference to FIG. 2, and the description is not repeated herein. Subsequently, an IMD layer $207_M$ is formed over the ESL $205_M$. In some embodiments, the IMD layer $207_M$ is formed using similar materials and methods as the IMD layer $207_1$ described above with reference to FIG. 2, and the description is not repeated herein.

In some embodiments, interconnects, such as conductive vias $1101_M$ and conductive lines $1103_M$, are formed in the IMD layer $207_M$ and the ESL $205_M$. In some embodiments, the conductive vias $1101_M$ and the conductive lines $1103_M$ may have similar structures as the conductive vias $1101_1$ and the conductive lines $1103_1$, with similar features being labeled by similar numerical references. In some embodiments, the conductive vias $1101_M$ and the conductive lines $1103_M$ may be formed using process steps as described above with reference to FIGS. 2-11, and the description is not repeated herein.

Referring back to FIG. 15, a magnified view of a region 1701 of the structure shown in FIG. 17 is illustrated in accordance with some embodiments. In the illustrated embodiment, the barrier layer 501 is deposited such that the barrier layer 501 fully covers and is in physical contact with sidewalls of the ESL $205_M$, and is in physically contact with the top surface of the conductive material 1003 of the conductive line $1103_{M-1}$. The barrier layer 501 covers corners formed by the sidewalls of the ESL $205_M$ and the top surface of the conductive material 1003 of the conductive line $1103_{M-1}$. In the illustrated embodiment, the adhesion layer 901 extends along and is in physical contact with the top surface of the conductive material 1003 of the conductive line $1103_{M-1}$. By selectively depositing the barrier layer 501 in the openings within the ESL $205_M$ and the IMD layer $207_M$, an amount (or volume) of the barrier layer 501 within the openings is reduced. As a result, a contact resistance between the conductive vias $1101_M$ and respective conductive lines $1103_{M-1}$ is reduced.

Referring back to FIG. 16, a magnified view of the region 1701 of the structure shown in FIG. 17 is illustrated in accordance with some embodiments. In the illustrated embodiment, the barrier layer 501 is deposited such that the barrier layer 501 partially covers and is in physical contact with sidewalls of the ESL $205_M$, and does not cover corners formed by the sidewalls of the ESL $205_M$ and the top surface of the conductive material 1003 of the conductive line $1103_{M-1}$. In some embodiments, the adhesion layer 901 covers corners formed by the sidewalls of the ESL $205_M$ and the top surface of the conductive material 1003 of the conductive line $1103_{M-1}$, is in physical contact with the sidewalls of the ESL $205_M$, and extends along and is in physical contact with the top surface of the conductive material 1003 of the conductive line $1103_{M-1}$. By selectively depositing the barrier layer 501 in the openings within the ESL $205_M$ and the IMD layer $207_M$, an amount (or volume) of the barrier layer 501 within the openings is reduced. As a result, a contact resistance between the conductive vias $1101_M$ and respective conductive lines $1103_{M-1}$ is reduced.

Figure 18:
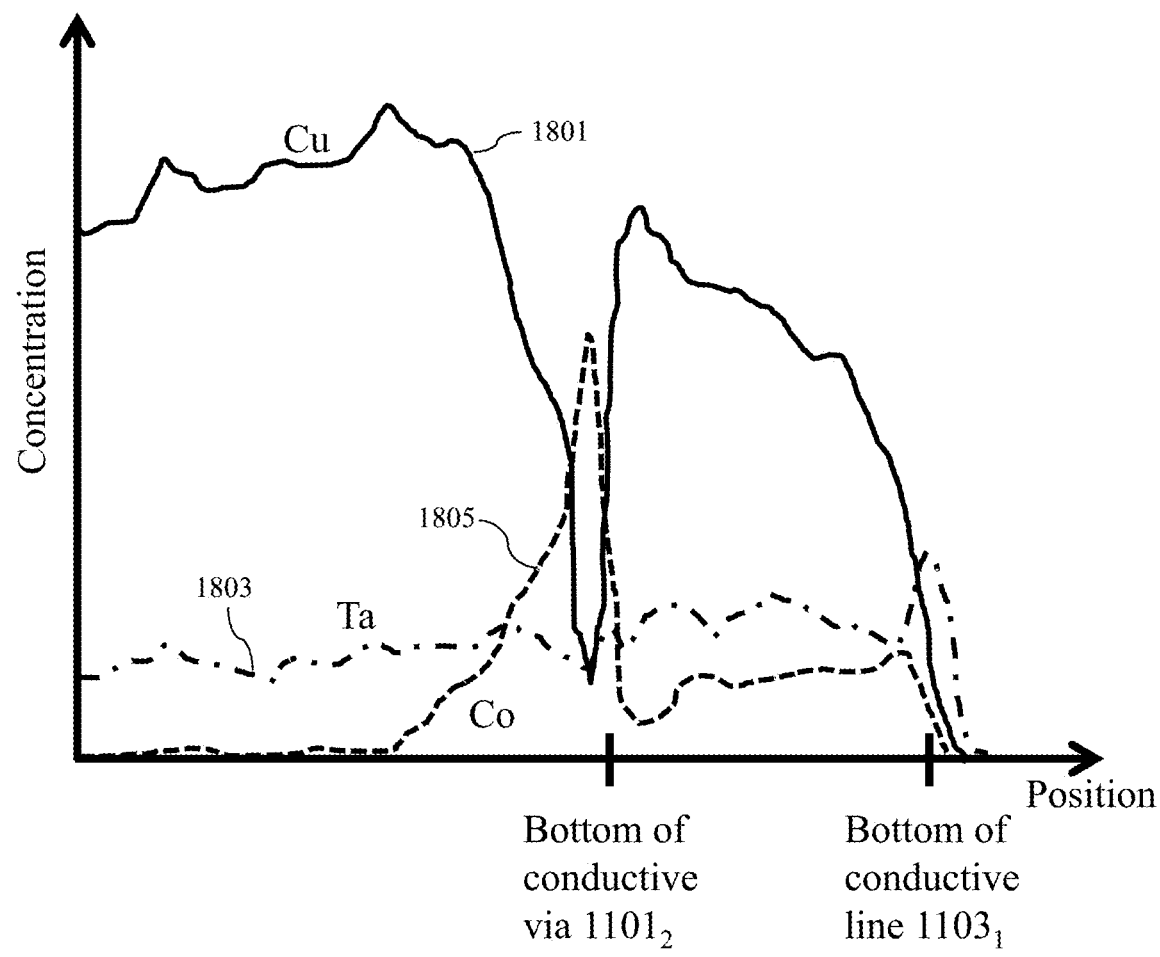
FIG. 18 illustrates concentration profiles of various elements within conductive features in accordance with some embodiments.

FIG. 18 illustrates concentration profiles of various elements within conductive via $1101_2$ and the conductive line $1103_1$ in accordance with some embodiments. In the illustrated embodiment, the concentration profiles of various elements are illustrated along a line 1703 illustrated in FIG. 17. In some embodiments, the concentration profiles may be determined by energy-dispersive X-ray spectroscopy (EDX), electron energy loss spectroscopy (EELS), secondary ion mass spectrometry (SIMS), or the like. In some embodiments when the barrier layer 501 comprises tantalum nitride, the adhesion layer 901 comprises cobalt, the seed layer 1001 comprises copper, and the conductive material 1003 comprise copper, the solid curve 1801 illustrates the concentration profile of copper, the dash-dotted curve 1803 illustrates the concentration profile of tantalum, and the dashed curve 1805 illustrates the concentration profile of cobalt. In some embodiments, the concentration of copper dips at a bottom of the conductive via $1101_2$ and at a bottom of the conductive line $1103_1$. In some embodiments, the concentration of cobalt reaches a maximal value at the bottom of the conductive via $1101_2$. In some embodiments, the concentration of tantalum reaches a maximal value at the bottom of the conductive line $1103_1$. In some embodiments, the concentration of tantalum at the bottom of the conductive via $1101_2$ is less than the concentration of tantalum at the bottom of the conductive line $1103_1$.

Figure 19:
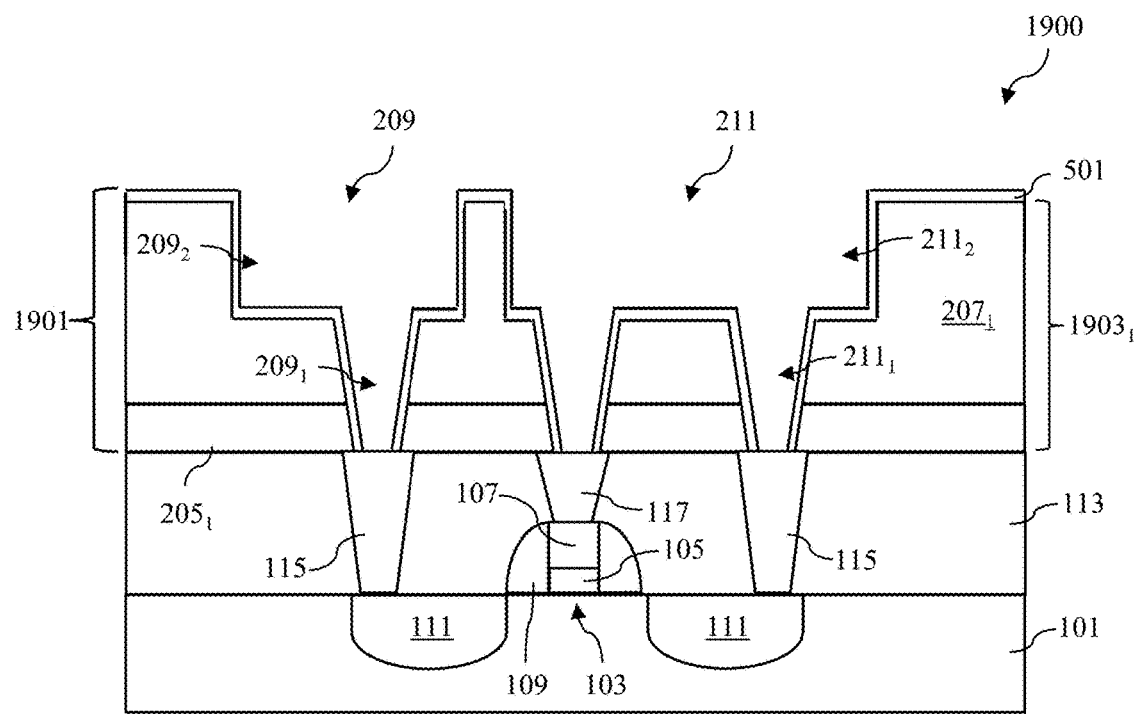
FIGS. 19-27 illustrate cross-sectional views of various intermediate stages of fabrication of a semiconductor device in accordance with some embodiments.

FIGS. 19-25 illustrate cross-sectional views of various intermediate stages of fabrication of a semiconductor device 1900 in accordance with some embodiments. In particular, FIGS. 19-25 illustrate cross-sectional views of various intermediate stages of fabrication of an interconnect structure 1901 over the structure of FIG. 1. Referring to FIG. 19, in some embodiments, the steps for forming the interconnect structure 1901 starts with forming a metallization layer $1903_1$ over the one or more ILD layers 113 and the contact plugs 115 and 117. In some embodiments, the formation of the metallization layer $1903_1$ starts with forming an ESL $205_1$ over the one or more ILD layers 113 and the contact plugs 115 and 117, and forming an IMD layer $207_1$ over the ESL $205_1$ as described above with reference to FIG. 2, and the description is not repeated herein.

In some embodiments, after forming the IMD layer $207_1$, openings 209 and 211 are formed within the IMD layer $207_1$ and the ESL $205_1$ as described above with reference to FIG. 2, and the description is not repeated herein. Subsequently, a barrier layer 501 is formed in the openings 209 and 211 as described above with reference to FIGS. 2-8, and the description is not repeated herein.

Figure 20:
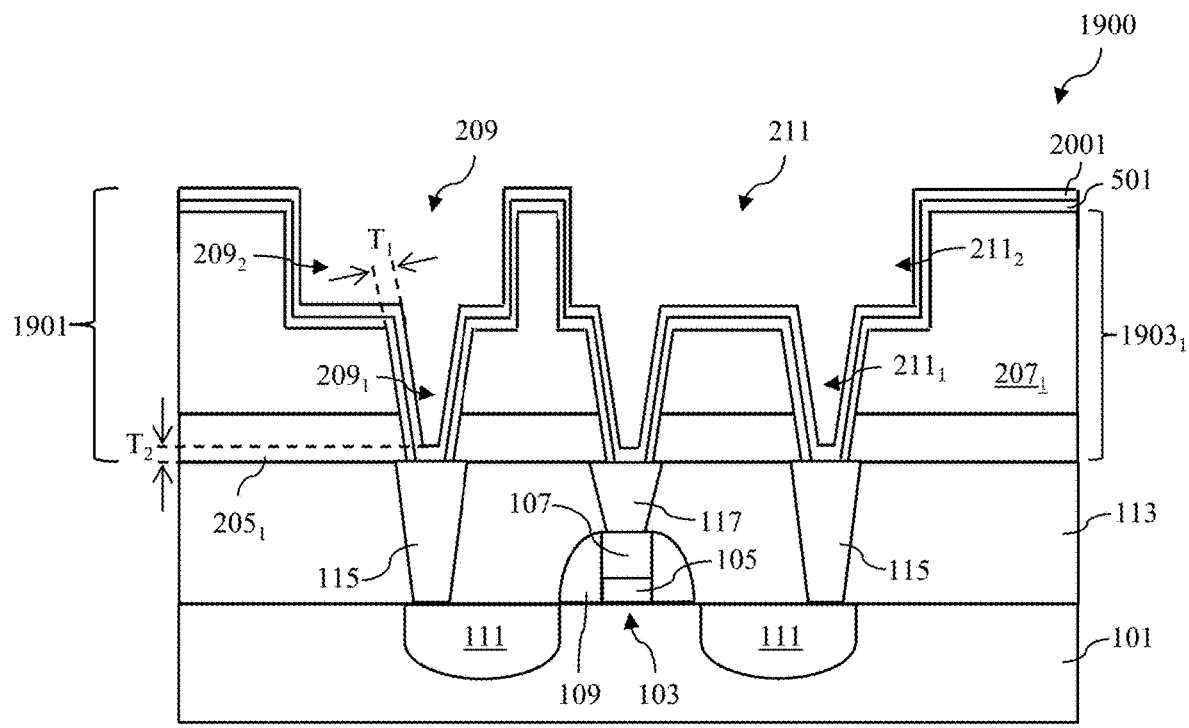

Referring to FIG. 20, a barrier layer 2001 is formed in the openings 209 and 211, and over the barrier layer 501. The barrier layer 2001 may comprise titanium, titanium nitride, tantalum, tantalum nitride, a combination thereof, a multilayer thereof, or the like. In some embodiments, the barrier layer 501 and the barrier layer 2001 may comprise a same material. In other embodiments, the barrier layer 501 and the barrier layer 2001 may comprise different materials. In some embodiments, the barrier layer 2001 is deposited along bottoms and sidewalls of the openings 209 and 211 using a deposition method that is unaffected by the surface modification process, which is performed before forming the barrier layer 501 as described above with reference to FIG. 4. In such embodiments, the barrier layer 2001 is formed over and in physical contact with the exposed surfaces of the contact plugs 115 and 117. In some embodiments, the barrier layer 2001 may be deposited using PVD, or the like. The barrier layers 501 and 2001 together may be also referred to as a combined barrier layer. In some embodiments, the combined barrier layer has a thickness $T_1$ along the sidewalls of the via openings $209_1$ and $211_1$ and a thickness $T_2$ along the bottoms of the via openings $209_1$ and $211_1$. In some embodiments, the thickness $T_1$ is greater than the thickness $T_2$. In some embodiments, the thickness $T_1$ is between about 10 Å and about 30 Å. In some embodiments, the thickness $T_2$ is between about 1 Å and about 10 Å. In some embodiments, a ratio of the thickness $T_1$ to the thickness $T_2$ ($T_1/T_2$) is between about 1 and about 30.

Figure 21:
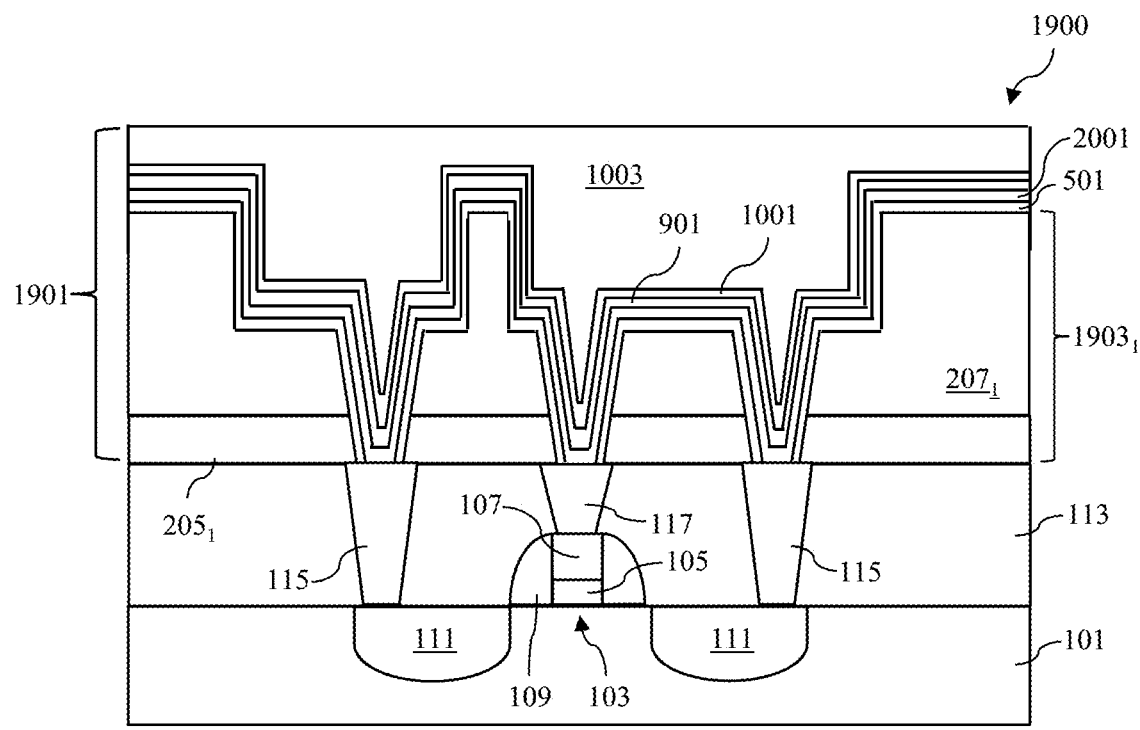

Referring to FIG. 21, after forming the barrier layer 2001, an adhesion layer 901 is formed in the openings 209 and 211 and over the barrier layer 2001 as described above with reference to FIG. 9, and the description is not repeated herein. Subsequently, a seed layer 1001 is formed in the openings 209 and 211 and over the adhesion layer 901 as described above with reference to FIG. 10, and the description is not repeated herein. After forming the seed layer 1001, a conductive material 1003 is formed in the openings 209 and 211 as described above with reference to FIG. 10, and the description is not repeated herein. In some embodiments, the conductive material 1003 overfills the openings 209 and 211.

Figure 22:
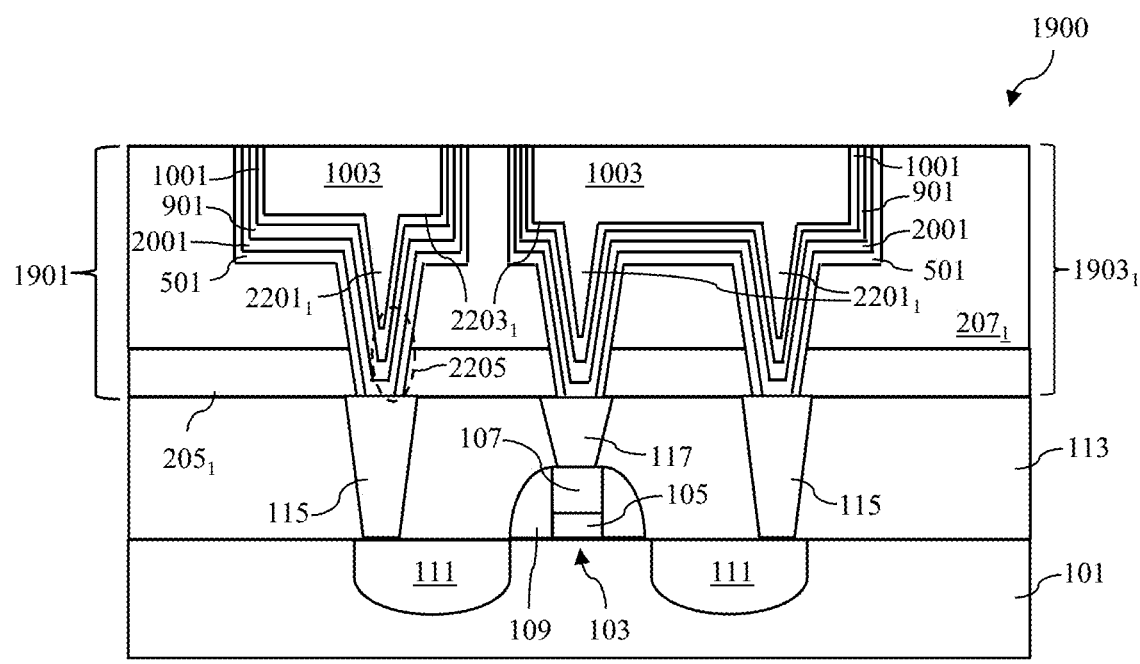

Referring to FIG. 22, portions of the barrier layers 501 and 2001, the adhesion layer 901, the seed layer 1001, and the conductive material 1003 overfilling the openings 209 and 211 (see FIG. 21) are removed to expose a top surface of the IMD layer $207_1$. In some embodiments, the removal process may be a planarization process comprising a CMP process, a grinding process, an etching process, a combination thereof, or the like. Remaining portions of the barrier layers 501 and 2001, the adhesion layer 901, the seed layer 1001, and the conductive material 1003 filling the via openings $209_1$ and $211_1$ (see FIG. 19) form conductive vias $2201_1$, and remaining portions of the barrier layers 501 and 2001, the adhesion layer 901, the seed layer 1001, and the conductive material 1003 filling the line openings $209_2$ and $211_2$ (see FIG. 19) form conductive lines $2203_1$. In some embodiments, topmost surfaces of the conductive lines $2203_1$ are substantially coplanar or level with a topmost surface of the IMD layer $207_1$ within process variations of the planarization process.

Figure 23:
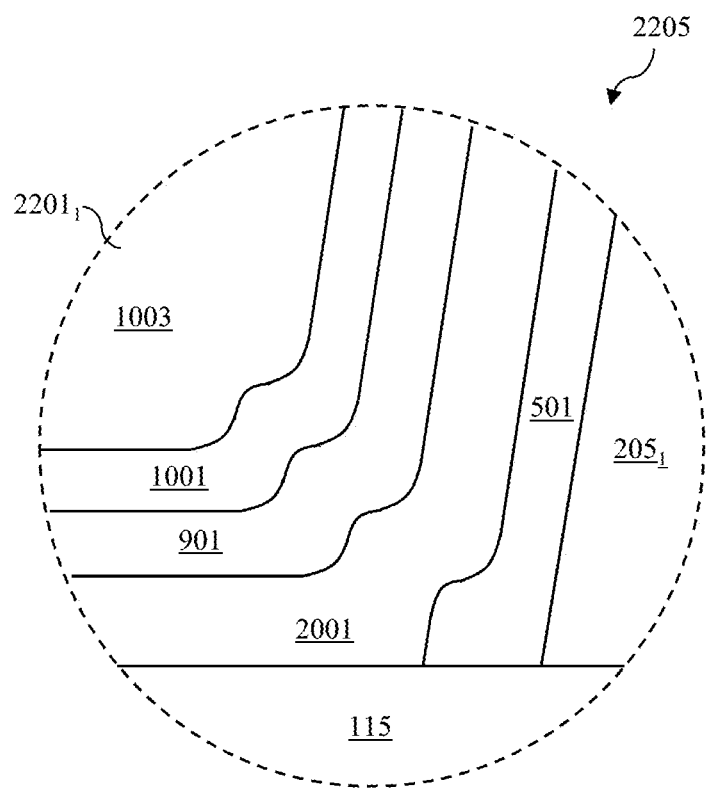

FIG. 23 illustrates a magnified view of a region 2205 of the structure shown in FIG. 22 in accordance with some embodiments. In the illustrated embodiment, the barrier layer 501 is deposited such that the barrier layer 501 fully covers and is in physical contact with sidewalls of the ESL $205_1$, and is in physically contact with the top surface of the contact plug 115. The barrier layer 501 covers corners formed by the sidewalls of the ESL $205_1$ and the top surface of the contact plug 115. In the illustrated embodiment, the barrier layer 2001 extends along and is in physical contact with the top surface of the contact plug 115.

Figure 24:
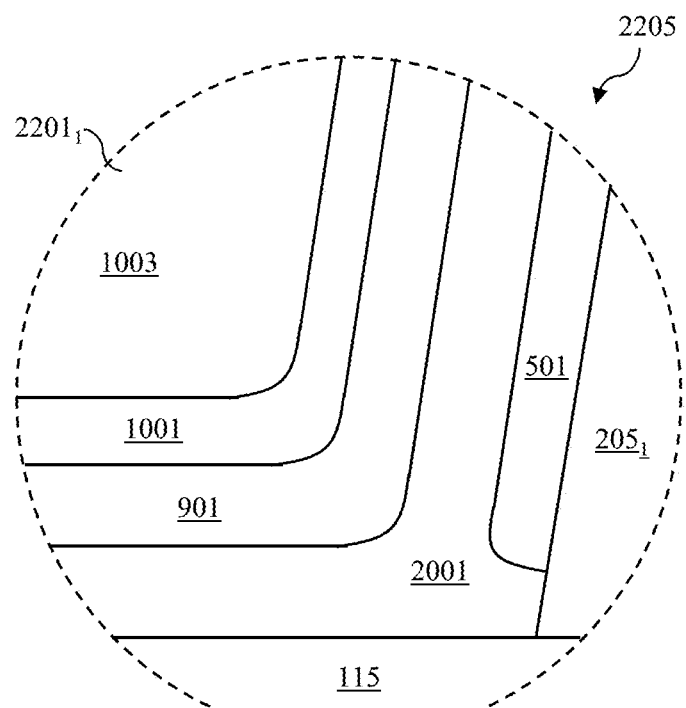

FIG. 24 illustrates a magnified view of the region 2205 of the structure shown in FIG. 22 in accordance with some embodiments. In the illustrated embodiment, the barrier layer 501 is deposited such that the barrier layer 501 partially covers and is in physical contact with sidewalls of the ESL $205_1$, and does not cover corners formed by the sidewalls of the ESL $205_1$ and the top surface of the contact plug 115. In some embodiments, the barrier layer 2001 covers corners formed by the sidewalls of the ESL $205_1$ and the top surface of the contact plug 115, is in physical contact with the sidewalls of the ESL $205_1$, and extends along and is in physical contact with the top surface of the contact plug 115.

Referring further to FIGS. 23 and 24, by depositing the barrier layers 501 and 2001 in the openings within the ESL $205_1$ and the IMD layer $207_1$, such that a thickness of the combined barrier layer on the bottoms of the openings is reduced compared to the sidewalls of the openings, an amount (or volume) of the combined barrier layer within the openings is reduced. As a result, a contact resistance between the conductive vias $2201_1$ and respective one of the contact plugs 115 and 117 is reduced.

Figure 25:
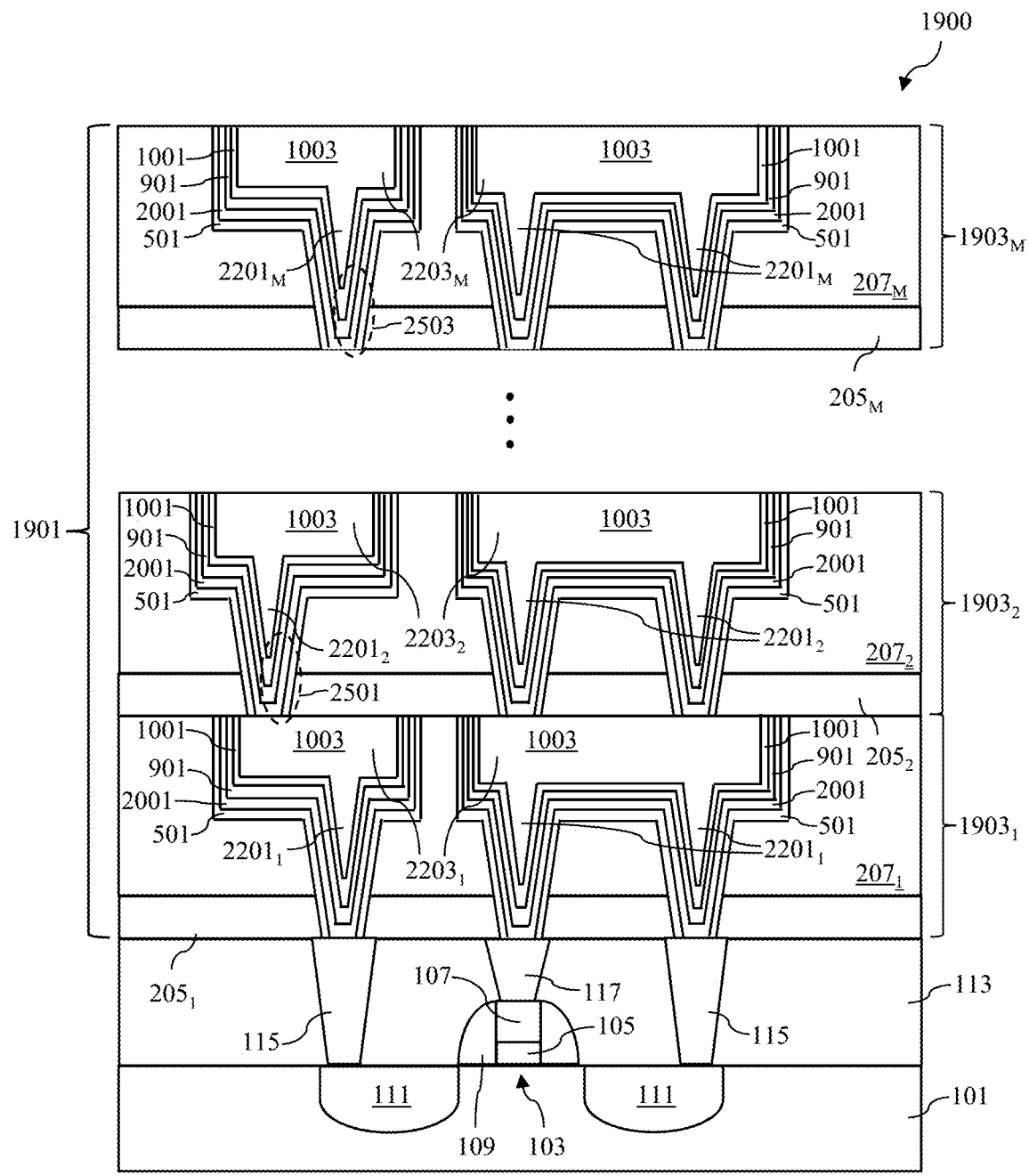

Referring to FIG. 25, a metallization layer $1903_2$ is formed over the metallization layer $1903_1$. In some embodiments, process steps for forming the metallization layer $1903_2$ start with forming an ESL $205_2$ over the metallization layer $1903_1$. In some embodiments, the ESL $205_2$ is formed using similar materials and methods as the ESL $205_1$ described above with reference to FIG. 2, and the description is not repeated herein. Subsequently, an IMD layer $207_2$ is formed over the ESL $205_2$. In some embodiments, the IMD layer $207_2$ is formed using similar materials and methods as the IMD layer $207_1$ described above with reference to FIG. 2, and the description is not repeated herein.

In some embodiments, interconnects, such as conductive vias $2201_2$ and conductive lines $2203_2$, are formed in the IMD layer $207_2$ and the ESL $205_2$. In some embodiments, the conductive vias $2201_2$ and the conductive lines $2203_2$ may have similar structures as the conductive vias $2201_1$ and the conductive lines $2203_1$, with similar features being labeled by similar numerical references. In some embodiments, the conductive vias $2201_2$ and the conductive lines $2203_2$ may be formed using process steps as described above with reference to FIGS. 19-22, and the description is not repeated herein.

In some embodiments, after forming the metallization layer $1903_2$, one or more metallization layers are formed over the metallization layer $1903_2$, until a metallization layer $1903_M$ is formed. In some embodiments, the metallization layer $1903_M$ is the final metallization layer of the interconnect structure 1901. In some embodiments, M may be between 1 and 5. In some embodiments, the intermediated metallization layers between the metallization layer $1903_2$ and the metallization layer $1903_M$ are formed in a similar manner as the metallization layer $1903_1$ and the description is not repeated herein. In other embodiments, the metallization layer $1903_M$ is not the final metallization layer of the interconnect structure 1901 and additional metallization layers are formed over the metallization layer $1903_M$.

In some embodiments, process steps for forming the metallization layer $1903_M$ start with forming an ESL $205_M$ over a previous metallization layer. In some embodiments, the ESL $205_M$ is formed using similar materials and methods as the ESL $205_1$ described above with reference to FIG. 2, and the description is not repeated herein. Subsequently, an IMD layer $207_M$ is formed over the ESL $205_M$. In some embodiments, the IMD layer $207_M$ is formed using similar materials and methods as the IMD layer $207_1$ described above with reference to FIG. 2, and the description is not repeated herein.

In some embodiments, interconnects, such as conductive vias $2201_M$ and conductive lines $2203_M$, are formed in the IMD layer $207_M$ and the ESL $205_M$. In some embodiments, the conductive vias $2201_M$ and the conductive lines $2203_M$ may have similar structures as the conductive vias $2201_1$ and the conductive lines $2203_1$, with similar features being labeled by similar numerical references. In some embodiments, the conductive vias $2201_M$ and the conductive lines $2203_M$ may be formed using process steps as described above with reference to FIGS. 19-22, and the description is not repeated herein.

Figure 26:
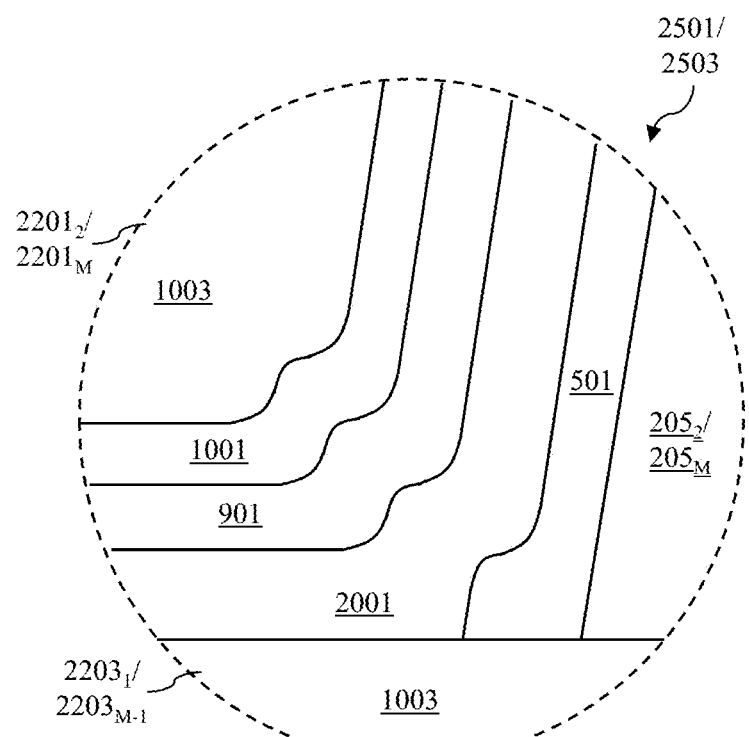

FIG. 26 illustrates magnified views of regions 2501 and 2503 of the structure shown in FIG. 25 in accordance with some embodiments. Referring first to the region 2501, in the illustrated embodiment, the barrier layer 501 is deposited such that the barrier layer 501 fully covers and is in physical contact with sidewalls of the ESL $205_2$, and is in physical contact with the top surface of the conductive material 1003 of the conductive line $2203_1$. The barrier layer 501 covers corners formed by the sidewalls of the ESL $205_2$ and the top surface of the conductive material 1003 of the conductive line $2203_1$. In the illustrated embodiment, the barrier layer 2001 extends along and is in physical contact with the top surface of the conductive material 1003 of the conductive line $2203_1$.

By depositing the barrier layers 501 and 2001 in the openings within the ESL $205_2$ and the IMD layer $207_2$, such that a thickness of the combined barrier layer on the bottoms of the openings is reduced compared to the sidewalls of the openings, an amount (or volume) of the combined barrier layer within the openings is reduced. As a result, a contact resistance between the conductive vias $2201_2$ and the respective conductive lines $2203_1$ is reduced.

Referring next to the region 2503, in the illustrated embodiment, the barrier layer 501 is deposited such that the barrier layer 501 fully covers and is in physical contact with sidewalls of the ESL $205_M$, and is in physically contact with the top surface of the conductive material 1003 of the conductive line $2203_{M-1}$. The barrier layer 501 covers corners formed by the sidewalls of the ESL $205_M$ and the top surface of the conductive material 1003 of the conductive line $2203_{M-1}$. In the illustrated embodiment, the barrier layer 2001 extends along and is in physical contact with the top surface of the conductive material 1003 of the conductive line $2203_{M-1}$.

By depositing the barrier layers 501 and 2001 in the openings within the ESL $205_M$ and the IMD layer $207_M$, such that a thickness of the combined barrier layer on the bottoms of the openings is reduced compared to the sidewalls of the openings, an amount (or volume) of the combined barrier layer within the openings is reduced. As a result, a contact resistance between the conductive vias $2201_M$ and the respective conductive lines $2203_{M-1}$ is reduced.

Figure 27:
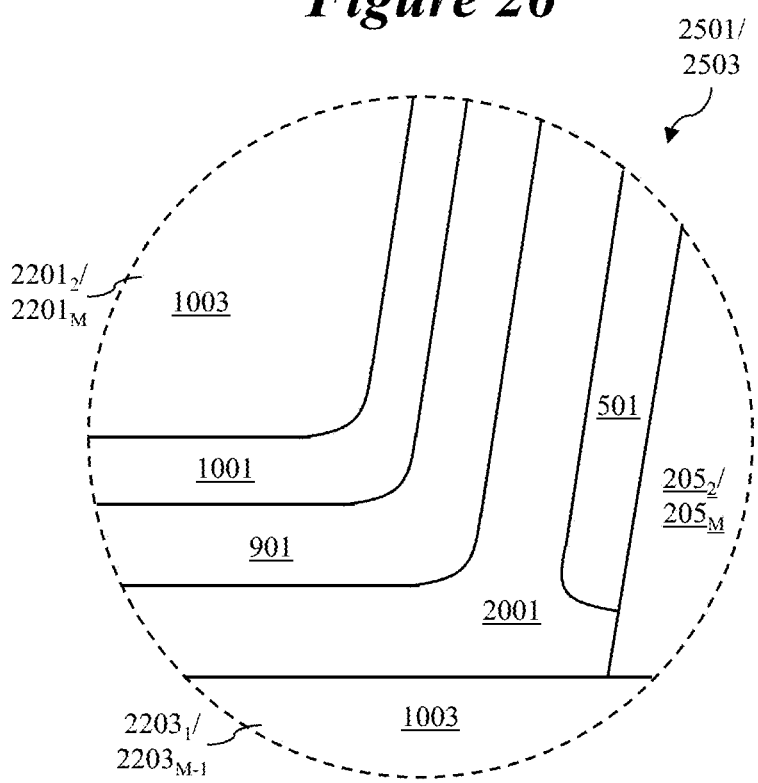

FIG. 27 illustrates magnified views of the regions 2501 and 2503 of the structure shown in FIG. 25 in accordance with some embodiments. Referring first to the region 2501, in the illustrated embodiment, the barrier layer 501 is deposited such that the barrier layer 501 partially covers and is in physical contact with sidewalls of the ESL $205_2$, and does not cover corners formed by the sidewalls of the ESL $205_2$ and the top surface of the conductive material 1003 of the conductive line $2203_1$. In some embodiments, the barrier layer 2001 covers corners formed by the sidewalls of the ESL $205_2$ and the top surface of the conductive material 1003 of the conductive line $2203_1$, is in physical contact with the sidewalls of the ESL $205_2$, and extends along and is in physical contact with the top surface of the conductive material 1003 of the conductive line $2203_1$.

By depositing the barrier layers 501 and 2001 in the openings within the ESL $205_2$ and the IMD layer $207_2$, such that a thickness of the combined barrier layer on the bottoms of the openings is reduced compared to the sidewalls of the openings, an amount (or volume) of the combined barrier layer within the openings is reduced. As a result, a contact resistance between the conductive vias $2201_2$ and the respective conductive lines $2203_1$ is reduced.

Referring next to the region 2503, in the illustrated embodiment, the barrier layer 501 is deposited such that the barrier layer 501 partially covers and is in physical contact with sidewalls of the ESL $205_M$, and does not cover corners formed by the sidewalls of the ESL $205_M$ and the top surface of the conductive material 1003 of the conductive line $2203_{M-1}$. In some embodiments, the adhesion layer 901 covers corners formed by the sidewalls of the ESL $205_M$ and the top surface of the conductive material 1003 of the conductive line $2203_{M-1}$, is in physical contact with the sidewalls of the ESL $205_M$, and extends along and is in physical contact with the top surface of the conductive material 1003 of the conductive line $2203_{M-1}$.

By depositing the barrier layers 501 and 2001 in the openings within the ESL $205_M$ and the IMD layer $207_M$, such that a thickness of the combined barrier layer on the bottoms of the openings is reduced compared to the sidewalls of the openings, an amount (or volume) of the combined barrier layer within the openings is reduced. As a result, a contact resistance between the conductive vias $2201_M$ and the respective conductive lines $2203_{M-1}$ is reduced.

Referring further to FIGS. 17 and 25, the interconnect structures 201 and 1900, respectively, are formed such that all of the interconnects (such as conductive vias and conductive lines) within each of the interconnect structures 201 and 1900 have similar structures and are formed using similar process steps. In other embodiments, different interconnects within the interconnect structure may have different structures and may be formed using different process steps. Such embodiments are described below with reference to FIGS. 28-30.

Figure 28:
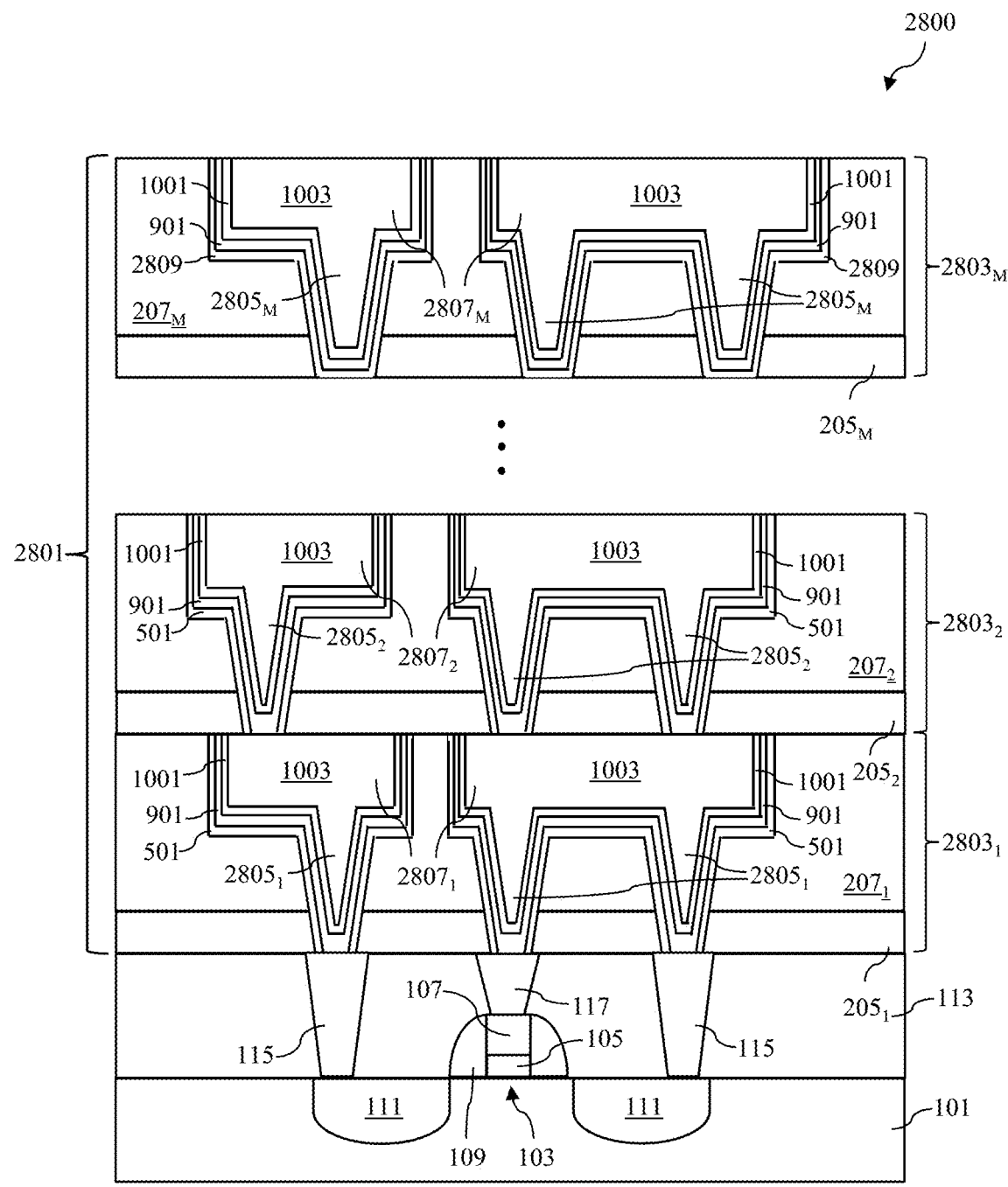
FIG. 28 illustrates a cross-sectional view of a semiconductor device in accordance with some embodiments.

FIG. 28 illustrates a cross-sectional view of a semiconductor device 2800 in accordance with some embodiments. In some embodiments, the semiconductor device 2800 is similar to the semiconductor device 100 illustrated in FIG. 17, with similar features being labeled with similar numerical references, and the descriptions of the similar features are not repeated herein. In some embodiments, the interconnect structure 2801 of the semiconductor device 2800 is similar to the interconnect structure 201 of the semiconductor device 100 (see FIG. 17), with similar features being labeled with similar numerical references, and the descriptions of the similar features are not repeated herein. The interconnect structure 2801 comprises a plurality of metallization layer $2803_1$ to $2803_M$. In some embodiments, the metallization layer $2803_M$ is the final metallization layer of the interconnect structure 2801. In some embodiments, M may be between 1 and 5. In other embodiments, the metallization layer $2803_M$ is not the final metallization layer of the interconnect structure 2801 and additional metallization layers are formed over the metallization layer $2803_M$.

In the illustrated embodiment, interconnects within different metallization layers of the interconnect structure 2801 have different structures. In particular, interconnects with different sizes may have different structures and may be formed using different process steps. In some embodiments, the metallization layer $2803_1$ of the interconnect structure 2801 comprises conductive vias $2805_1$ and conductive lines $2807_1$. In some embodiments when a width of the conductive vias $2805_1$ at the bottom of the conductive vias $2805_1$ is between about 5 nm and about 10 nm, the conductive vias $2805_1$ and conductive lines $2807_1$ may be formed using process steps described above with reference to FIGS. 2-11, and the description is not repeated herein. In such embodiments, the metallization layer $2803_1$ is similar to the metallization layer $203_1$ (see FIG. 17).

In some embodiments, the metallization layer $2803_2$ of the interconnect structure 2801 comprises conductive vias $2805_2$ and conductive lines $2807_2$. In some embodiments when a width of the conductive vias $2805_2$ at the bottom of the conductive vias $2805_2$ is between about 8 nm and about 14 nm, the conductive vias $2805_2$ and conductive lines $2807_2$ may be formed using process steps described above with reference to FIGS. 2-11, and the description is not repeated herein. In such embodiments, the metallization layer $2803_2$ is similar to the metallization layer $203_2$ (see FIG. 17). Furthermore, the metallization layer $2803_1$ and the metallization layer $2803_2$ have interconnects with similar structures.

In some embodiments, the metallization layer $2803_M$ of the interconnect structure 2801 comprises conductive vias $2805_M$ and conductive lines $2807_M$. In the illustrated embodiment, a width of the conductive vias $2805_M$ is greater than the width of the conductive vias $2805_1$ and the width of the conductive vias $2805_2$. In some embodiments when a width of the conductive vias $2805_M$ at the bottom of the conductive vias $2805_M$ is between about 15 nm and about 30 nm, the conductive vias $2805_M$ and conductive lines $2807_M$ may be formed using process steps similar to the process steps described above with reference to FIGS. 2-11, with the distinction that the surface modification process steps described above with reference to FIGS. 3 and 4 are omitted. In such embodiments, instead of forming the barrier layer 501 (see FIG. 5), the barrier layer 2809 is formed over and in physical contact with the conductive line of the underlying metallization layer. Accordingly, the metallization layer $2803_M$ and the metallization layer $2803_1$ have interconnects with different structures. In some embodiments, the barrier layer 2809 may comprise titanium, titanium nitride, tantalum, tantalum nitride, a combination thereof, a multilayer thereof, or the like, and may be deposited using ALD, CVD, PVD, a combination thereof, or the like.

In some embodiments, interconnects of the metallization layers interposed between the metallization layer $2803_2$ and the metallization layer $2803_M$, may have different structures depending on the size of the interconnects. In some embodiments when widths of vias are between about 5 nm and about 14 nm, interconnects are formed to have structures similar to interconnects (such as the conductive vias $2805_1$ and the conductive lines $2807_1$) of the metallization layer $2803_1$. In some embodiments when widths of vias are between about 15 nm and about 30 nm, interconnects are formed to have structures similar to interconnects (such as the conductive vias $2805_M$ and the conductive lines $2807_M$) of the metallization layer $2803_M$.

Figure 29:
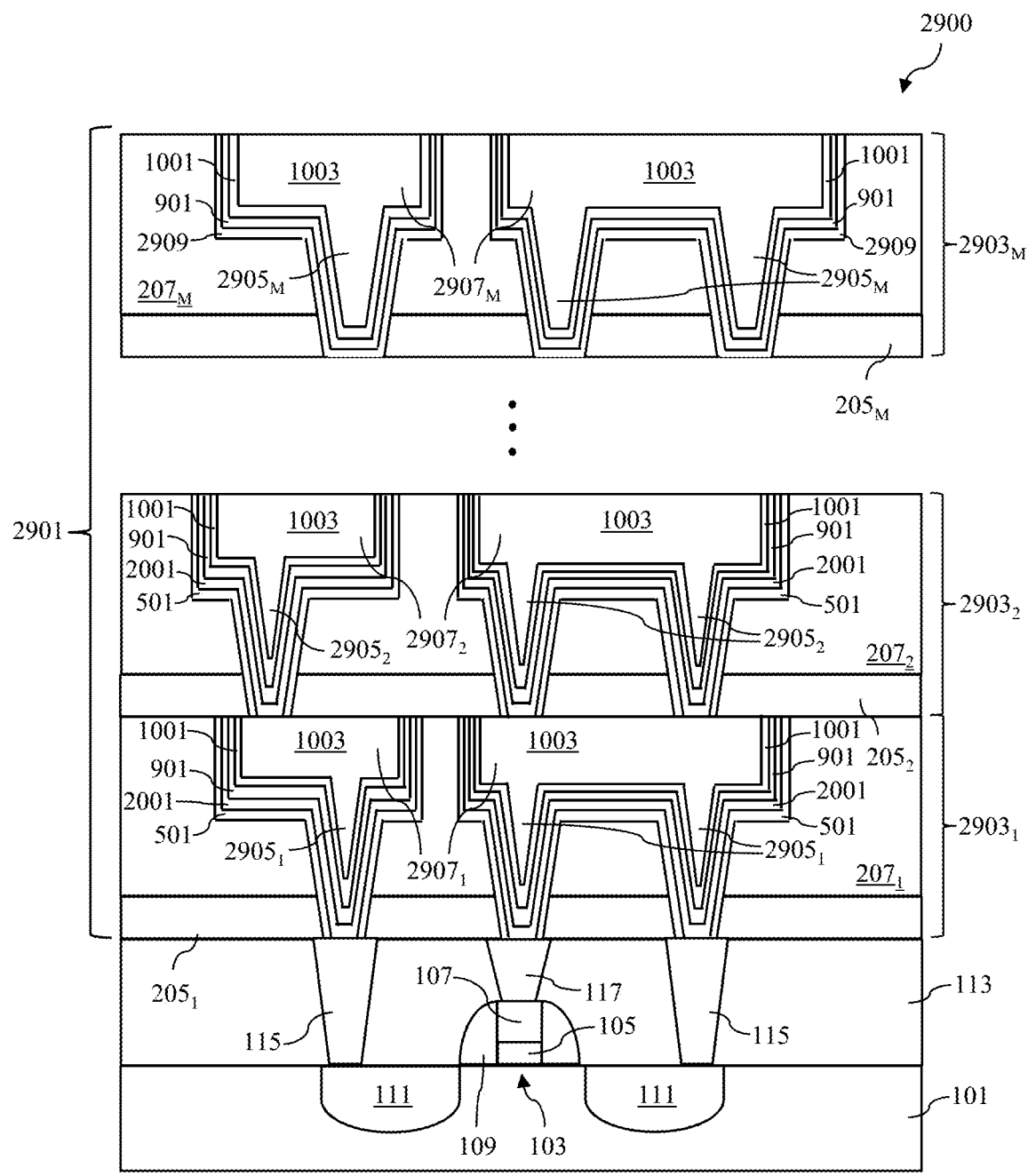
FIG. 29 illustrates a cross-sectional view of a semiconductor device in accordance with some embodiments.

FIG. 29 illustrates a cross-sectional view of a semiconductor device 2900 in accordance with some embodiments. In some embodiments, the semiconductor device 2900 is similar to the semiconductor device 1900 illustrated in FIG. 25, with similar features being labeled with similar numerical references, and the descriptions of the similar features are not repeated herein. In some embodiments, the interconnect structure 2901 of the semiconductor device 2900 is similar to the interconnect structure 1901 of the semiconductor device 1900 (see FIG. 25), with similar features being labeled with similar numerical references, and the descriptions of the similar features are not repeated herein. The interconnect structure 2901 comprises a plurality of metallization layer $2903_1$ to $2903_M$. In some embodiments, the metallization layer $2903_M$ is the final metallization layer of the interconnect structure 2901. In some embodiments, M may be between 1 and 5. In other embodiments, the metallization layer $2903_M$ is not the final metallization layer of the interconnect structure 2901 and additional metallization layers are formed over the metallization layer $2903_M$.

In the illustrated embodiment, interconnects within different metallization layers of the interconnect structure 2901 have different structures. In particular, interconnects with different sizes may have different structures and may be formed using different process steps. In some embodiments, the metallization layer $2903_1$ of the interconnect structure 2901 comprises conductive vias $2905_1$ and conductive lines $2907_1$. In some embodiments when a width of the conductive vias $2905_1$ at the bottom of the conductive vias $2905_1$ is between about 6 nm and about 10 nm, the conductive vias $2905_1$ and conductive lines $2907_1$ may be formed using process steps described above with reference to FIGS. 19-22, and the description is not repeated herein. In such embodiments, the metallization layer $2903_1$ is similar to the metallization layer $1903_1$ (see FIG. 25).

In some embodiments, the metallization layer $2903_2$ of the interconnect structure 2901 comprises conductive vias $2905_2$ and conductive lines $2907_2$. In some embodiments when a width of the conductive vias $2905_2$ at the bottom of the conductive vias $2905_2$ is between about 8 nm and about 14 nm, the conductive vias $2905_2$ and conductive lines $2907_2$ may be formed using process steps described above with reference to FIGS. 19-22, and the description is not repeated herein. In such embodiments, the metallization layer $2903_2$ is similar to the metallization layer $1903_2$ (see FIG. 25). Furthermore, the metallization layer $2903_1$ and the metallization layer $2903_2$ have interconnects with similar structures.

In some embodiments, the metallization layer $2903_M$ of the interconnect structure 2901 comprises conductive vias $2905_M$ and conductive lines $2907_M$. In the illustrated embodiment, a width of the conductive vias $2905_M$ is greater than the width of the conductive vias $2905_1$ and the width of the conductive vias $2905_2$. In some embodiments when a width of the conductive vias $2905_M$ at the bottom of the conductive vias $2905_M$ is between about 15 nm and about 30 nm, the conductive vias $2905_M$ and conductive lines $2907_M$ may be formed using process steps similar to the process steps described above with reference to FIGS. 2-11, with the distinction that the surface modification process steps described above with reference to FIGS. 3 and 4 are omitted. In such embodiments, instead of forming the barrier layer 501 (see FIG. 5), the barrier layer 2909 is formed over and in physical contact with the conductive line of the underlying metallization layer. Accordingly, the metallization layer $2903_M$ and the metallization layer $2903_1$ have interconnects with different structures. In some embodiments, the barrier layer 2909 may comprise titanium, titanium nitride, tantalum, tantalum nitride, a combination thereof, a multilayer thereof, or the like, and may be deposited using ALD, CVD, PVD, a combination thereof, or the like.

In some embodiments, interconnects of the metallization layers interposed between the metallization layer $2903_2$ and the metallization layer $2903_M$, may have different structures depending on the size of the interconnects. In some embodiments when widths of vias are between about 6 nm and about 14 nm, interconnects are formed to have structures similar to interconnects (such as the conductive vias $2905_1$ and the conductive lines $2907_1$) of the metallization layer $2903_1$. In some embodiments when widths of vias are between about 15 nm and about 30 nm, interconnects are formed to have structures similar to interconnects (the conductive vias $2905_M$ and the conductive lines $2907_M$) of the metallization layer $2903_M$.

Figure 30:
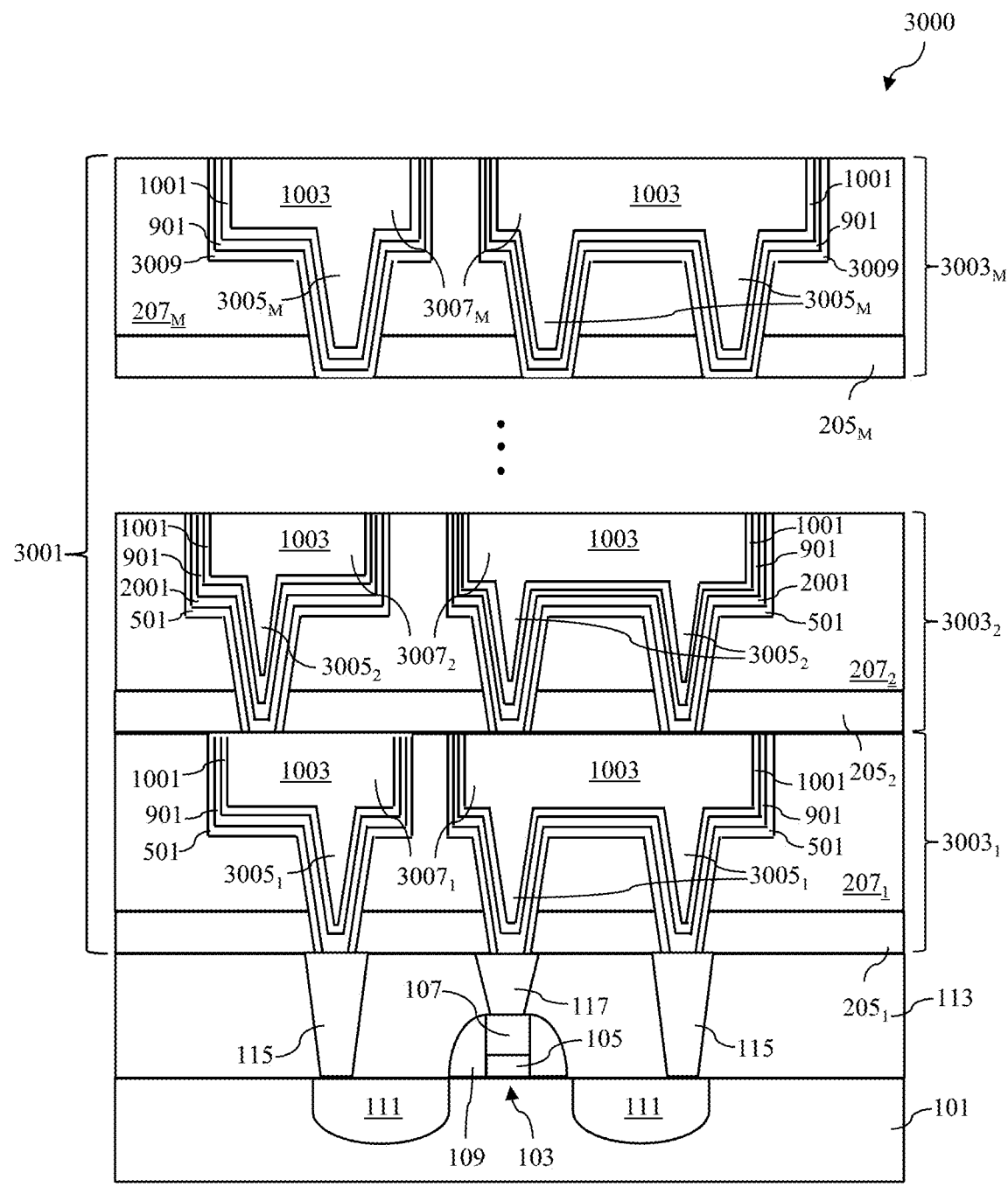
FIG. 30 illustrates a cross-sectional view of a semiconductor device in accordance with some embodiments.

FIG. 30 illustrates a cross-sectional view of a semiconductor device 3000 in accordance with some embodiments. In some embodiments, the semiconductor device 3000 is similar to the semiconductor devices 100 and 1900 illustrated in FIGS. 17 and 25, respectively, with similar features being labeled with similar numerical references, and the descriptions of the similar features are not repeated herein.

In some embodiments, the interconnect structure 3001 of the semiconductor device 3000 is similar to the interconnect structures 201 and 1901 of the semiconductor device 100 and 1900, respectively (see FIGS. 17 and 25), with similar features being labeled with similar numerical references, and the descriptions of the similar features are not repeated herein. The interconnect structure 3001 comprises a plurality of metallization layer $3003_1$ to $3003_M$. In some embodiments, the metallization layer $3003_M$ is the final metallization layer of the interconnect structure 3001. In some embodiments, M may be between 1 and 5. In other embodiments, the metallization layer $3003_M$ is not the final metallization layer of the interconnect structure 3001 and additional metallization layers are formed over the metallization layer $3003_M$.

In the illustrated embodiment, interconnects within different metallization layers of the interconnect structure 3001 have different structures. In particular, interconnects with different sizes may have different structures and may be formed using different process steps. In some embodiments, the metallization layer $3003_1$ of the interconnect structure 3001 comprises conductive vias $3005_1$ and conductive lines $3007_1$. In some embodiments when a width of the conductive vias $3005_1$ at the bottom of the conductive vias $3005_1$ is between about 5 nm and about 10 nm, the conductive vias $3005_1$ and conductive lines $3007_1$ may be formed using process steps described above with reference to FIGS. 2-11, and the description is not repeated herein. In such embodiments, the metallization layer $3003_1$ is similar to the metallization layer $203_1$ (see FIG. 17).

In some embodiments, the metallization layer $3003_2$ of the interconnect structure 3001 comprises conductive vias $3005_2$ and conductive lines $3007_2$. In some embodiments when a width of the conductive vias $3005_2$ at the bottom of the conductive vias $3005_2$ is between about 8 nm and about 14 nm, the conductive vias $3005_2$ and conductive lines $3007_2$ may be formed using process steps described above with reference to FIGS. 19-22, and the description is not repeated herein. In such embodiments, the metallization layer $3003_2$ is similar to the metallization layer $1903_2$ (see FIG. 25). Furthermore, the metallization layer $3003_1$ and the metallization layer $3003_2$ have interconnects with different structures.

In some embodiments, the metallization layer $3003_M$ of the interconnect structure 3001 comprises conductive vias $3005_M$ and conductive lines $3007_M$. In the illustrated embodiment, a width of the conductive vias $3005_M$ is greater than the width of the conductive vias $3005_1$ and the width of the conductive vias $3005_2$. In some embodiments when the width of the conductive vias $3005_M$ at the bottom of the conductive vias $3005_M$ is between about 15 nm and about 30 nm, the conductive vias $3005_M$ and conductive lines $3007_M$ may be formed using process steps similar to the process steps described above with reference to FIGS. 2-11, with the distinction that the surface modification process steps described above with reference to FIGS. 3 and 4 are omitted. In such embodiments, instead of forming the barrier layer 501 (see FIG. 5), the barrier layer 3009 is formed over and in physical contact with the conductive line of the underlying metallization layer. Accordingly, the metallization layer $3003_M$ and the metallization layer $3003_1$ have interconnects with different structures. Furthermore, the metallization layer $3003_M$ and the metallization layer $3003_2$ have interconnects with different structures. In some embodiments, the barrier layer 3009 may comprise titanium, titanium nitride, tantalum, tantalum nitride, a combination thereof, a multi-layer thereof, or the like, and may be deposited using ALD, CVD, PVD, a combination thereof, or the like.

In some embodiments, interconnects of the metallization layers interposed between the metallization layer $3003_2$ and the metallization layer $3003_M$, may have different structures depending on the size of the interconnects. In some embodiments when widths of vias are between about 5 nm and about 10 nm, interconnects are formed to have structures similar to interconnects (such as the conductive vias $3005_1$ and the conductive lines $3007_1$) of the metallization layer $3003_1$. In some embodiments when widths of vias are between about 8 nm and about 14 nm, interconnects are formed to have structures similar to interconnects (such as the conductive vias $3005_2$ and the conductive lines $3007_2$) of the metallization layer $3003_2$. In some embodiments when widths of vias are between about 15 nm and about 30 nm, interconnects are formed to have structures similar to interconnects (the conductive vias $3005_M$ and the conductive lines $3007_M$) of the metallization layer $3003_M$.

Figure 31:
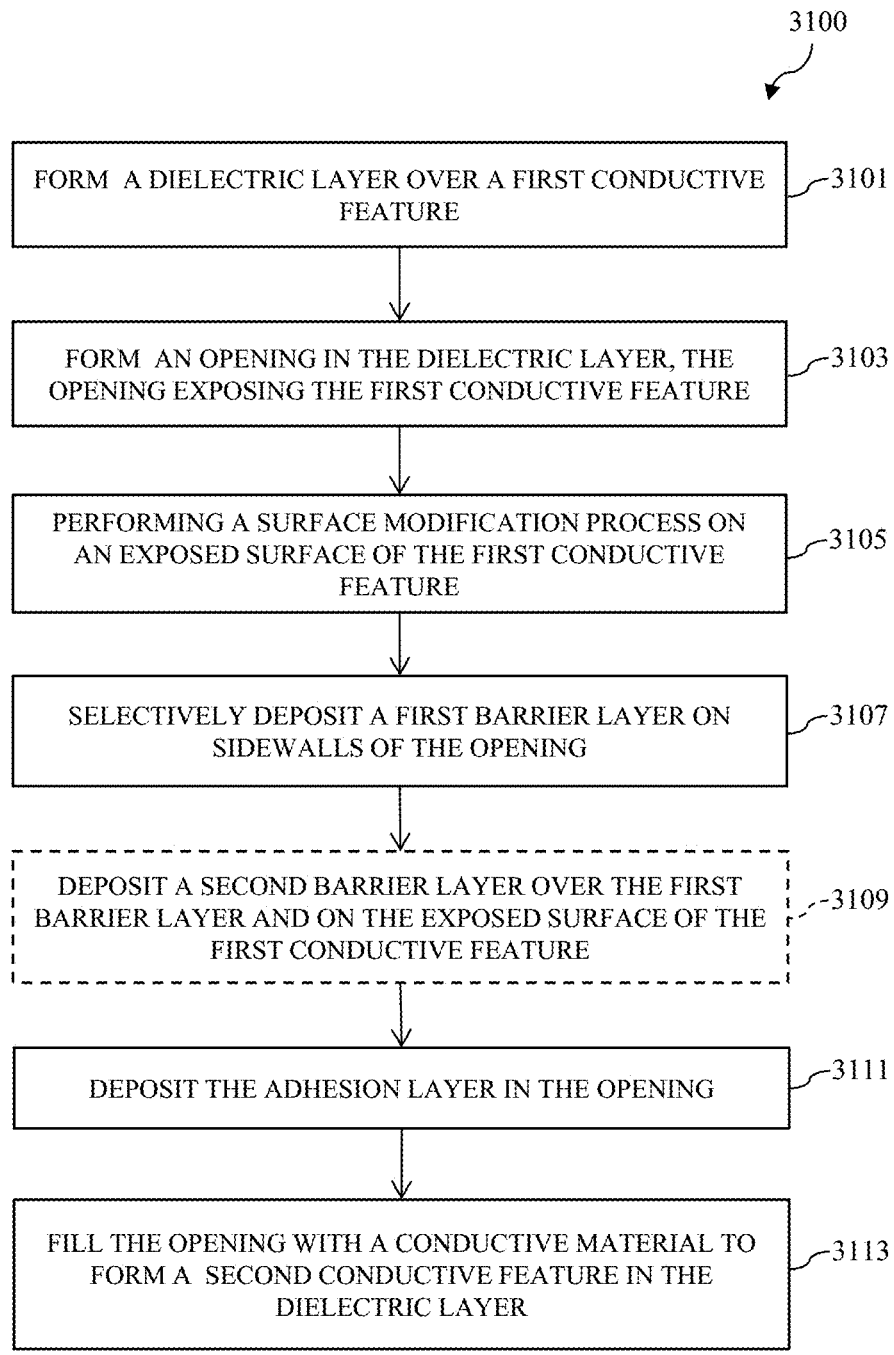
FIG. 31 is a flow diagram illustrating a method of forming an interconnect structure in accordance with some embodiments.

FIG. 31 is a flow diagram illustrating a method 3100 of forming an interconnect structure in accordance with some embodiments. The method 3100 starts with step 3101, where a dielectric layer is formed over a first conductive feature as described above with reference to FIG. 2. In step 3103, an opening is formed in the dielectric layer, such that the opening exposes the first conductive feature as described above with reference to FIG. 2. In step 3105, a surface modification process is performed on an exposed surface of the first conductive feature as described above with reference to FIGS. 3 and 4. In step 3107, a first barrier layer is selectively deposited on sidewalls of the opening as described above with reference to FIG. 5. In step 3109, a second barrier layer is deposited over the first barrier layer and on the exposed surface of the first conductive feature as described above with reference to FIG. 20. In some embodiments, step 3109 is omitted. In step 3111, an adhesion layer is deposited in the opening as described above with reference to FIG. 9. In step 3113, the opening is filled with a conductive material to form a second conductive feature in the dielectric layer as described above with reference to FIGS. 10 and 11.

Figure 32:
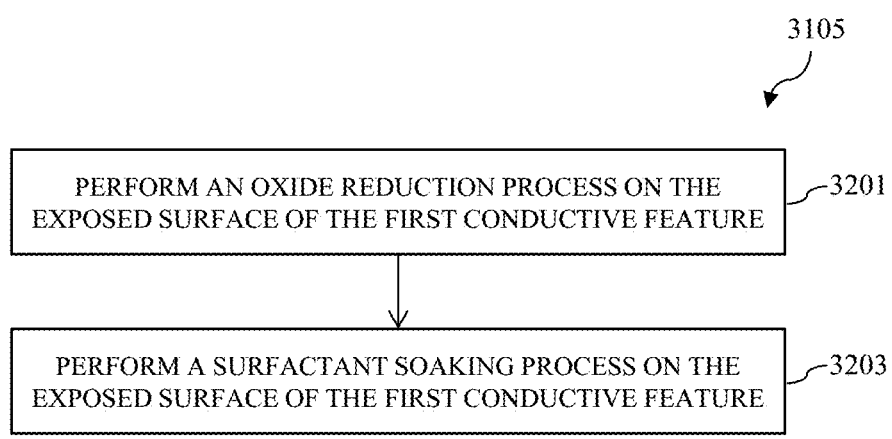
FIG. 32 is a flow diagram illustrating a surface modification process in accordance with some embodiments.

FIG. 32 is a flow diagram illustrating the surface modification process 3105 of the method 3100 (see FIG. 31) in accordance with some embodiments. The surface modification process 3105 starts with step 3201, where an oxide reduction process is performed on the exposed surface of the first conductive feature as described above with reference to FIG. 3. In step 3203, a surfactant soaking process is performed on the exposed surface of the first conductive feature as described above with reference to FIG. 4.

Embodiments may achieve advantages. Various embodiments discussed herein allow for reducing an amount (or volume) of a barrier layer within an interconnect (such as, for example, a conductive via) and, as a result, reducing a contact resistance between interconnects.

In accordance with an embodiment, a method includes depositing a dielectric layer over a conductive feature. The dielectric layer is patterned to form an opening therein. The opening exposes a first portion of the conductive feature. A first barrier layer is deposited on a sidewall of the opening. The first portion of the conductive feature remains exposed at the end of depositing the first barrier layer. In an embodiment, the method further includes depositing a second barrier layer over the first barrier layer in the opening, the second barrier layer being in physical contact with the first portion of the conductive feature. In an embodiment, the first barrier layer is separated from the first portion of the conductive feature by the second barrier layer. In an embodiment, the method further includes: before depositing the first barrier layer, removing a native oxide layer from the first portion of the conductive feature; and before depositing the first barrier layer, performing a surfactant soaking process on the first portion of the conductive feature, the surfactant soaking process suppressing a deposition rate of a first barrier material of the first barrier layer over the first portion of the conductive feature. In an embodiment, the surfactant soaking process forms a surfactant layer over the first portion of the conductive feature. In an embodiment, the surfactant layer comprises a monolayer of alkene molecules or a monolayer of alkyne molecules. In an embodiment, the method further includes: depositing an adhesion layer over the first barrier layer in the opening, the adhesion layer being in physical contact with the first portion of the conductive feature; and filling the opening with a conductive material.

In accordance with another embodiment, a method includes forming a dielectric layer over a first conductive feature. An opening is formed in the dielectric layer. The opening exposes a first portion of the first conductive feature. A second conductive feature is formed in the opening. Forming the second conductive feature includes performing a surface modification process on a top surface of the first portion of the first conductive feature. The surface modification process suppresses a deposition rate of a first barrier material over the top surface of the first portion of the first conductive feature. A first barrier layer including the first barrier material is selectively deposited on a sidewall of the opening. In an embodiment, performing the surface modification process includes: performing an oxide reduction process on the top surface of the first portion of the first conductive feature, the oxide reduction process removing a native oxide layer from the first portion of the first conductive feature; and performing a surfactant soaking process on the top surface of the first portion of the first conductive feature, the surfactant soaking process forming a surfactant layer over the top surface of the first portion of the first conductive feature. In an embodiment, the surfactant layer includes alkene molecules or alkyne molecules. In an embodiment, performing the oxide reduction process includes performing a plasma process on the top surface of the first portion of the first conductive feature. In an embodiment, the method further includes depositing an adhesion layer over the first barrier layer and on a bottom of the opening, the adhesion layer being in physical contact with the top surface of the first portion of the first conductive feature. In an embodiment, the method further includes depositing a second barrier layer including a second barrier material over the first barrier layer and on a bottom of the opening, the second barrier layer being in physical contact with the top surface of the first portion of the first conductive feature.

In accordance with yet another embodiment, a semiconductor structure includes a first conductive feature, a dielectric layer over the first conductive feature, and a second conductive feature within the dielectric layer and in electrical contact with the first conductive feature. A top surface of the first conductive feature has a first region and a second region different from the first region. The dielectric layer covers the first region of the top surface of the first conductive feature. The dielectric layer does not cover the second region of the top surface of the first conductive feature. The second conductive feature includes a conductive material and a first barrier layer interposed between a sidewall of the conductive material and a sidewall of the dielectric layer. The first barrier layer does not cover the second region of the top surface of the first conductive feature. In an embodiment, the semiconductor structure further includes an adhesion layer interposed between the sidewall of the conductive material and the first barrier layer, where the adhesion layer covers the second region of the top surface of the first conductive feature. In an embodiment, the adhesion layer is in physical contact with the sidewall of the dielectric layer. In an embodiment, the adhesion layer is separated from the sidewall of the dielectric layer by the first barrier layer. In an embodiment, the semiconductor structure further includes a second barrier layer interposed between the sidewall of the conductive material and the first barrier layer, where the second barrier layer covers the second region of the top surface of the first conductive feature. In an embodiment, an interface between the first barrier layer and the second barrier layer is in physical contact with the sidewall of the dielectric layer. In an embodiment, an interface between the first barrier layer and the second barrier layer is in physical contact with the second region of the top surface of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a dielectric layer over a conductive feature;
    patterning the dielectric layer to form an opening therein, the opening exposing a first portion of the conductive feature;
    depositing a first barrier layer on a sidewall of the opening, wherein the first portion of the conductive feature remains exposed at the end of depositing the first barrier layer;
    before depositing the first barrier layer, removing a native oxide layer from the first portion of the conductive feature; and
    before depositing the first barrier layer, performing a surfactant soaking process on the first portion of the conductive feature, the surfactant soaking process suppressing a deposition rate of a first barrier material of the first barrier layer over the first portion of the conductive feature.

2. The method of claim 1, further comprising depositing a second barrier layer over the first barrier layer in the opening, the second barrier layer being in physical contact with the first portion of the conductive feature.

3. The method of claim 2, wherein the second barrier layer is a non-conformal layer.

4. The method of claim 2, wherein the first barrier layer is separated from the first portion of the conductive feature by the second barrier layer.

5. The method of claim 1, wherein the surfactant soaking process forms a surfactant layer over the first portion of the conductive feature.

6. The method of claim 5, wherein the surfactant layer comprises a monolayer of alkene molecules or a monolayer of alkyne molecules.

7. The method of claim 1, further comprising:
depositing an adhesion layer over the first barrier layer in the opening, the adhesion layer being in physical contact with the first portion of the conductive feature; and filling the opening with a conductive material.

8. The method of claim 7, wherein the adhesion layer is in physical contact with the sidewall of the opening.

9. The method of claim 1, wherein the first barrier layer is in physical contact with the first portion of the conductive feature.

10. A method comprising:
forming a dielectric layer over a first conductive feature;
forming an opening in the dielectric layer, the opening exposing a first portion of the first conductive feature; and
forming a second conductive feature in the opening, wherein forming the second conductive feature comprises:
performing a surface modification process on a top surface of the first portion of the first conductive feature, the surface modification process suppressing a deposition rate of a first barrier material over the top surface of the first portion of the first conductive feature, wherein performing the surface modification process comprises:
performing an oxide reduction process on the top surface of the first portion of the first conductive feature, the oxide reduction process removing a native oxide layer from the first portion of the first conductive feature; and
performing a surfactant soaking process on the top surface of the first portion of the first conductive feature, the surfactant soaking process forming a surfactant layer over the top surface of the first portion of the first conductive feature; and
selectively depositing a first barrier layer comprising the first barrier material on a sidewall of the opening.

11. The method of claim 10, wherein the surfactant layer comprises alkene molecules or alkyne molecules.

12. The method of claim 10, wherein performing the oxide reduction process comprises performing a plasma process on the top surface of the first portion of the first conductive feature.

13. The method of claim 10, further comprising depositing an adhesion layer over the first barrier layer and on a bottom of the opening, the adhesion layer being in physical contact with the top surface of the first portion of the first conductive feature.

14. The method of claim 13, wherein the adhesion layer is in physical contact with the sidewall of the opening.

15. The method of claim 10, further comprising depositing a second barrier layer comprising a second barrier material over the first barrier layer and on a bottom of the opening, the second barrier layer being in physical contact with the top surface of the first portion of the first conductive feature.

16. The method of claim 15, wherein the second barrier layer is in physical contact with the sidewall of the opening.

17. A semiconductor structure comprising:
a first conductive feature, a top surface of the first conductive feature having a first region and a second region different from the first region;
a dielectric layer over the first conductive feature, wherein the dielectric layer covers the first region of the top surface of the first conductive feature, and wherein the dielectric layer does not cover the second region of the top surface of the first conductive feature; and
a second conductive feature within the dielectric layer and in electrical contact with the first conductive feature, the second conductive feature comprising:
a conductive material;
a first barrier layer interposed between a sidewall of the conductive material and a sidewall of the dielectric layer, wherein the first barrier layer does not cover the second region of the top surface of the first conductive feature; and
an adhesion layer interposed between the sidewall of the conductive material and the first barrier layer, wherein the adhesion layer covers the second region of the top surface of the first conductive feature, and wherein the adhesion layer is in physical contact with the sidewall of the dielectric layer.

18. The semiconductor structure of claim 17, wherein the adhesion layer comprises cobalt, ruthenium, an alloy thereof, a combination thereof, or a multilayer thereof.

19. The semiconductor structure of claim 17, wherein the first barrier layer comprises titanium, titanium nitride, tantalum, tantalum nitride, a combination thereof, or a multilayer thereof.

20. The semiconductor structure of claim 17, wherein the first conductive feature is a conductive line and the second conductive feature is a conductive via.

* * * * *